United States Patent
Yamao et al.

(10) Patent No.: US 8,628,687 B2
(45) Date of Patent: Jan. 14, 2014

(54) SIALON-BASED OXYNITRIDE PHOSPHOR AND PRODUCTION METHOD THEREOF

(75) Inventors: Takeshi Yamao, Ube (JP); Tetsuo Yamada, Ube (JP); Shin-ichi Sakata, Ube (JP)

(73) Assignee: Ube Industries, Ltd. (JP)

( * ) Notice: Subject to any disclaimer, the term of this patent is extended or adjusted under 35 U.S.C. 154(b) by 0 days.

(21) Appl. No.: 13/611,824

(22) Filed: Sep. 12, 2012

(65) Prior Publication Data

US 2013/0001815 A1   Jan. 3, 2013

Related U.S. Application Data

(62) Division of application No. 12/307,398, filed as application No. PCT/JP2007/063510 on Jun. 29, 2007, now abandoned.

(30) Foreign Application Priority Data

Jul. 5, 2006   (JP) ................................. 2006-185134

(51) Int. Cl.
   *C09K 11/08*   (2006.01)
   *C09K 11/66*   (2006.01)

(52) U.S. Cl.
   USPC .................................................. 252/301.4 F

(58) Field of Classification Search
   USPC .................................................. 252/301.4 F
   See application file for complete search history.

(56) References Cited

U.S. PATENT DOCUMENTS

| | | | |
|---|---|---|---|
| 6,632,379 B2 | 10/2003 | Mitomo et al. | |
| 6,776,927 B2 | 8/2004 | Mitomo et al. | |
| 7,074,346 B2 * | 7/2006 | Yamada et al. | 252/301.4 F |
| 7,258,818 B2 | 8/2007 | Sakata et al. | |
| 7,598,194 B2 | 10/2009 | Hirosaki et al. | |
| 7,906,040 B2 | 3/2011 | Mitomo et al. | |
| 8,153,023 B2 * | 4/2012 | Shioi | 252/301.4 F |
| 2003/0030038 A1 * | 2/2003 | Mitomo et al. | 252/500 |
| 2005/0001225 A1 | 1/2005 | Yoshimura et al. | |
| 2005/0194604 A1 | 9/2005 | Sakuma et al. | |
| 2008/0143246 A1 * | 6/2008 | Hirosaki et al. | 313/503 |

FOREIGN PATENT DOCUMENTS

| | | |
|---|---|---|
| EP | 1 445 295 A1 | 8/2004 |
| EP | 1 498 466 A1 | 1/2005 |
| EP | 1 55 307 A2 | 7/2005 |
| EP | 1 772 509 A1 | 4/2007 |
| EP | 1 783 096 A1 | 5/2007 |
| JP | 11-302020 A | 11/1999 |
| JP | 11-322446 A | 11/1999 |
| JP | 2002-194346 A | 7/2002 |
| JP | 2002-363554 A | 12/2002 |
| JP | 2004-67837 A | 3/2004 |
| JP | 2004-238505 | 8/2004 |
| JP | 2005-36038 A | 2/2005 |
| JP | 2005-162808 A | 6/2005 |
| JP | 2005-255885 A | 9/2005 |
| JP | 2006-45271 | 2/2006 |
| WO | 2005/102921 | 11/2005 |
| WO | 2005/123876 | 12/2005 |
| WO | WO2008/010498 | * 1/2008 |

* cited by examiner

*Primary Examiner* — Carol M Koslow
*Assistant Examiner* — Matthew E Hoban
(74) *Attorney, Agent, or Firm* — DLA Piper LLP (US)

(57) ABSTRACT

An oxynitride phosphor includes an α-sialon as the main component, which is represented by the formula: $M_xSi_{12-(m+n)}Al_{(m+n)}O_nN_{16-n}{:}Ln_y$ (wherein $0.3 \leq x+y<1.5$, $0<y<0.7$, $0.3 \leq m<4.5$, $0<n<2.25$, and assuming that the atomic valence of the metal M is a and the atomic valence of the lanthanide metal Ln is b, $m=ax+by$) and in which the aggregation index, $A_1=D_{50}/D_{BET} \leq 3.0$ or the aggregation index $A_2=D_{50}/D_{particle} \leq 3.0$; and a production method and usage of the phosphor.

9 Claims, 3 Drawing Sheets

SIALON-BASED OXYNITRIDE PHOSPHOR AND PRODUCTION METHOD THEREOF

RELATED APPLICATIONS

This application is a divisional of U.S. patent application Ser. No. 12/307,398, filed Jan. 5, 2009, which is a §371 of International Application No. PCT/JP2007/063510, with an international filing date of Jun. 29, 2007 (WO 2008/004640 A1, published Jan. 10, 2008), which is based on Japanese Patent Application No. 2006-185134, filed on Jul. 5, 2006, the subject matter of which is incorporated by reference.

TECHNICAL FIELD

This disclosure relates to an optical functional material having a function of converting a part of irradiation light into light at a wavelength different from that of the irradiation light and at the same time, mixing the converted light with the unconverted irradiation light to cause conversion into light differing in the color, and a production method thereof. More specifically, the disclosure relates to a rare earth metal element-activated sialon-based oxynitride phosphor used for a white light-emitting diode (white LED) using a blue light-emitting diode (blue LED) as a light source. The disclosure also relates to a production method of a sialon-based oxynitride phosphor for the above-described white light-emitting diode (white LED).

BACKGROUND

With recent implementation of blue LEDs, studies are being aggressively made to develop a white LED using the blue LED. The white LED requires low power consumption compared with existing white light sources and has a long life, and therefore expansion of its application to backlights for liquid crystal panels, indoor or outdoor lighting devices, and the like is proceeding.

The present white LED is obtained by coating a Ce-doped YAG (yttrium·aluminum·garnet) on the surface of blue LED. However, the fluorescence wavelength of Ce-doped YAG is in the vicinity of 530 nm and when this fluorescence color and light of blue LED are mixed to produce white light, the light is slightly blue-tinged and good white color cannot be obtained.

Meanwhile, an α-sialon-based phosphor activated by a rare earth element is known to emit fluorescence of which the wavelength is longer than the fluorescence wavelength of Ce-doped YAG (is shifted to red side) (see Kokai (Japanese Unexamined Patent Publication) No. 2002-363554). In the production method of a phosphor described in Kokai No. 2002-363554, silicon nitride is used as a raw material and after mixing a calcium source, a rare earth metal source and an aluminum source all at once, the reaction to sialon is allowed to proceed while compressing the powder by using a hot-press method.

On the other hand, Kokai No. 2005-162808 discloses a production method of a sialon-based phosphor, comprising using, as the raw material, a silicon nitride powder containing from 5 to 95 wt % of crystalline silicon nitride, mixing a calcium source, a rare earth metal source and an aluminum source all at once with the powder, and allowing the reaction to sialon to proceed by using a normal-pressure firing method.

Better white light can be obtained by combining a sialon-based phosphor produced as above with light emission of blue LED and, therefore, it is expected that a phosphor material comprising a sialon-based oxynitride is put into practical use as a novel phosphor material.

However, the phosphor having a composition disclosed in JP '554 is obtained as a firm sintered body because the reaction to sialon is allowed to proceed while compressing the powder by using a hot-press method, and for forming the sintered body into powder particles, a strong grinding treatment is necessary. Even when a grinding treatment is applied, only an aggregate of massive particles each resulting from firm fusion bonding of primary particles is obtained and this is not suited for use as a phosphor powder.

On the other hand, the sialon-based phosphor produced by the method disclosed in JP '808 can be obtained as a phosphor powder that is not largely aggregated. However, in this method, the yield of the sialon powder having a particle diameter of 2 to 20 μm is less than 55 wt %. Moreover, the amount of Eu remaining in the particle after acid treatment is small, and excessive Eu needs to be added for obtaining a high-brightness phosphor powder. The obtained sialon-based phosphor is an aggregate of massive particles each resulting from fusion bonding of primary particles, and the incident light is scattered on the aggregate surface in a large ratio due to the effect of irregularities on the outer periphery of the aggregate particle. Furthermore, there is a problem that as the particle becomes finer, the brightness of the phosphor decreases. As for the fluorescent material, a phosphor powder having a particle diameter of 2 to 20 μm, being less aggregated and causing no reduction in the emission intensity even when the powder becomes a fine particle is preferred.

This disclosure has been made to solve the above-described problems and an object of the disclosure is to provide a sialon-based oxynitride phosphor having high brightness at an emission wavelength of 560 to 620 nm. Another object of the disclosure is to provide a sialon-based oxynitride phosphor having high brightness, a desired particle size distribution and excellent miscibility with a resin and thereby achieve high brightness and stabilized color tone of an illuminating device such as white LED using blue LED as the light source or of an image display device having an excitation source such as electron beam. Such a phosphor powder is suitable for forming a thin coated film and has a property that the fluorescence is uniform and the emission intensity is high. Still another object of the disclosure is to provide a novel production method of a sialon-based oxynitride phosphor, where a sialon-based oxynitride phosphor having high brightness and excellent miscibility with a resin as described above can be obtained in a high yield.

SUMMARY

The dispersibility of a powder is determined by the ratio between the secondary particle size and the primary particle size. As for the specific measure for evaluating the dispersibility, there is employed an aggregation index $A_1$ or $A_2$ defined, for example, as a ratio $A_1$ between the median diameter $D_{50}$ [μm] in the particle size distribution curve and the equivalent-sphere diameter $D_{BET}$ [μm] calculated on the basis of the BET specific surface area, $$A_1 = D_{50}/D_{BET}$$

or a ratio $A_2$ between the median diameter $D_{50}$ [μm] in the particle size distribution curve and the primary particle diameter $D_{particle}$ [μm] measured by the image analysis of a scanning electron micrograph, $$A_2 = D_{50}/D_{particle},$$

We have studied the correlation between the mixing and firing method for a raw material powder containing silicon nitride and various substances as a lithium source, a calcium source, a rare earth metal source and an aluminum source, which are used for the production of a sialon-based oxynitride phosphor, and the dispersibility and fluorescent property of the produced powder. As a result, it has been found that: when instead of mixing the raw material powder all at once, a part of the raw material powder is previously mixed and fired and to the obtained first raw material powder, the remaining raw material powder is again added, mixed and fired, a sialon-based oxynitride phosphor assured of less fusion bonding or aggregation and high dispersibility, with the difference between the secondary particle size and the primary particle size being small, can be produced; a monodisperse sialon-based oxynitride phosphor can be obtained by selecting the combination of various raw materials and the firing conditions; and only a sialon-based oxynitride powder having specific particle diameter, particle size distribution and dispersibility can be utilized as a phosphor giving uniform fluorescence and high emission intensity. This disclosure has been accomplished based on these findings.

This disclosure provides, as means to attain the above-described objects, an oxynitride phosphor comprising an α-sialon as the main component, which is represented by the formula: $M_xSi_{12-(m+n)}Al_{(m+n)}O_nN_{16-n}:Ln_y$ (wherein $0.3 \leq x+y<1.5$, $0<y<0.7$, $0.3 \leq m<4.5$, $0<n<2.25$, and assuming that the atomic valence of the metal M is a and the atomic valence of the lanthanide metal Ln is b, $m=ax+by$), wherein an α-sialon with a part or all of the metal M (M is at least one metal selected from the group consisting of Li, Ca, Mg, Ba, Sr, Y and a lanthanide metal excluding La, Ce, Pr, Eu, Dy, Er, Tb and Yb) solid-dissolved in the α-sialon being substituted by a lanthanide metal Ln (Ln is at least one lanthanide metal selected from the group consisting of Ce, Pr, Eu, Dy, Er, Tb and Yb) working as a luminescence center is contained as the main component and wherein the aggregation index, $A_1=D_{50}/D_{BET}$, defined as the ratio between the median diameter $D_{50}$ [μm] in the particle size distribution curve and the equivalent-sphere diameter $D_{BET}$ [μm] calculated on the basis of the BET specific surface area is 3.0 or less.

The disclosure also provides an oxynitride phosphor comprising an α-sialon as the main component, which is represented by the formula:

(wherein $0.3 \leq x+y<1.5$, $0<y<0.7$, $0.3 \leq m<4.5$, $0<n<2.25$, and assuming that the atomic valence of the metal M is a and the atomic valence of the lanthanide metal Ln is b, $m=ax+by$), wherein an α-sialon with a part or all of the metal M (M is at least one metal selected from the group consisting of Li, Ca, Mg, Ba, Sr, Y and a lanthanide metal excluding La, Ce, Pr, Eu, Dy, Er, Tb and Yb) solid-dissolved in the α-sialon being substituted by a lanthanide metal Ln (Ln is at least one lanthanide metal selected from the group consisting of Ce, Pr, Eu, Dy, Er, Tb and Yb) working as a luminescence center is contained as the main component and wherein the aggregation index, $A_2=D_{50}/D_{particle}$, defined as the ratio between the median diameter $D_{50}$ [μm] in the particle size distribution curve and the primary particle diameter $D_{particle}$ [μm] measured by the image analysis of a scanning electron micrograph is 3.0 or less.

In one example, the above-described oxynitride phosphor comprising an α-sialon as the main component is provided, wherein the median diameter $D_{50}$ in the particle size distribution curve is 8.0 μm or less.

In one example, the above-described oxynitride phosphor comprising an α-sialon as the main component is provided, wherein the equivalent-sphere diameter $D_{BET}$ calculated on the basis of the BET specific surface area is 8.0 μm or less.

In one example, the oxynitride phosphor comprising an α-sialon as the main component is provided, wherein the primary particle diameter $D_{particle}$ measured by the image analysis of a scanning electron micrograph is 8.0 μm or less.

In one example, the above-described oxynitride phosphor comprising an α-sialon as the main component is provided, wherein the ratio $D_{90}/D_{10}$ between the 90% diameter $D_{90}$ in the particle size distribution curve and the 10% diameter $D_{10}$ is 4.0 or less.

In one example, the oxynitride phosphor comprising an α-sialon as the main component is provided, wherein in the formula: $M_xSi_{12-(m+n)}Al_{(m+n)}O_nN_{16-n}:Ln_y$, $1.0 \leq n \leq 1.25$.

In one example, the oxynitride phosphor comprising an α-sialon as the main component is provided, wherein in the formula: $M_xSi_{12-(m+n)}Al_{(m+n)}O_nN_{16-n}:Ln_y$, $0.5<n<1.0$, and the aggregation index $A_1=D_{50}/D_{BET}$ is 2.0 or less.

In one example, the oxynitride phosphor comprising an α-sialon as the main component is provided, wherein in the formula: $M_xSi_{12-(m+n)}Al_{(m+n)}O_nN_{16-n}:Ln_y$, $0.5<n<1.0$, and the aggregation index $A_2=D_{50}/D_{particle}$ is 2.0 or less.

Furthermore, we provide, as means to attain the above-described objects, a production method of an oxynitride phosphor comprising an α-sialon as the main component, comprising:

a first step of firing a mixed powder obtained by adding at least one kind of a metal compound selected from the group consisting of:

a nitride, an oxynitride, an oxide or a precursor substance becoming an oxide upon thermal decomposition, of a metal M (M is at least one metal selected from the group consisting of Li, Ca, Mg, Ba, Sr, Y and a lanthanide metal excluding La, Ce, Pr, Eu, Dy, Er, Tb and Yb) solid-dissolved in an α-sialon represented by the formula: $M_xSi_{12-(m+n)}Al_{(m+n)}O_nN_{16-n}:Ln_y$ (wherein $0.3 \leq x+y<1.5$, $0<y<0.7$, $0.3 \leq m<4.5$, $0<n<2.25$, and assuming that the atomic valence of the metal M is a and the atomic valence of the lanthanide metal Ln is b, $m=ax+by$), and a nitride, an oxynitride, an oxide or a precursor substance becoming an oxide upon thermal decomposition, of a lanthanide metal Ln (Ln is at least one lanthanide metal selected from the group consisting of Ce, Pr, Eu, Dy, Er, Tb and Yb) substituting a part or all of the metal element M to work as a luminescence center, to a silicon nitride powder, at 1,400 to 1,800° C. in a nitrogen-containing inert gas atmosphere to obtain a first raw material powder, a second step of adding at least one metal compound selected from the group consisting of:

a nitride, an oxynitride, an oxide or a precursor substance becoming an oxide upon thermal decomposition, of the metal M, a nitride, an oxynitride, an oxide or a precursor substance becoming an oxide upon thermal decomposition, of the lanthanide metal Ln substituting a part or all of the metal element M to work as a luminescence center, and an aluminum nitride powder, an aluminum oxynitride powder, an aluminum oxide powder or a precursor powder becoming aluminum oxide upon thermal decomposition, to the first raw material powder, and weighing and mixing these to give an α-sialon composition represented by the formula:

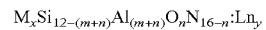

thereby obtaining a mixed powder, and a third step of firing the obtained mixed powder at 1,500 to 2,000° C. in a nitrogen-containing inert gas atmosphere.

In one example, the above-described production method of an oxynitride phosphor is provided, wherein the second step is a step of mixing at least one kind of a metal compound selected from the group consisting of:

a nitride, an oxynitride, an oxide or a precursor substance becoming an oxide upon thermal decomposition, of the metal M solid-dissolved in the α-sialon represented by the formula above, and a nitride, an oxynitride, an oxide or a precursor substance becoming an oxide upon thermal decomposition, of the lanthanide metal Ln substituting a part or all of the metal element M to work as a luminescence center, together with at least one kind of an aluminum compound powder selected from an aluminum nitride powder, an aluminum oxynitride powder, an aluminum oxide powder and a precursor powder becoming aluminum oxide upon thermal decomposition, to obtain a second raw material powder, and weighing and mixing the first raw material powder and the second raw material powder to give an α-sialon composition represented by the formula above, thereby obtaining a mixed powder.

In one example, the above-described production method of an oxynitride phosphor comprising an α-sialon as the main component is provided, wherein the first step is a step of firing a mixed powder obtained by adding:

at least one kind of a metal M compound selected from a nitride, an oxynitride, an oxide and a precursor substance becoming an oxide upon thermal decomposition, of a metal M (M is at least one metal selected from the group consisting of Li, Ca, Mg, Ba, Sr, Y and a lanthanide metal excluding La, Ce, Pr, Eu, Dy, Er, Tb and Yb) solid-dissolved in an α-sialon represented by the formula: $M_xSi_{12-(m+n)}Al_{(m+n)}O_nN_{16-n}$:$Ln_y$ (wherein $0.3 \leq x+y<1.5$, $0<y<0.7$, $0.3 \leq m<4.5$, $0<n<2.25$, and assuming that the atomic valence of the metal M is a and the atomic valence of the lanthanide metal Ln is b, $m=ax+by$), and at least one kind of a metal Ln compound selected from a nitride, an oxynitride, an oxide and a precursor substance becoming an oxide upon thermal decomposition, of a lanthanide metal Ln (Ln is at least one lanthanide metal selected from the group consisting of Ce, Pr, Eu, Dy, Er, Tb and Yb) substituting a part or all of the metal element M and working out to the center of light emission, to a silicon nitride powder, at 1,400 to 1,800° C. in a nitrogen-containing inert gas atmosphere to obtain a first raw material powder, and the second step is a step of mixing two or more kinds of aluminum compound powders selected from the group consisting of an aluminum nitride powder, an aluminum oxynitride powder, an aluminum oxide powder and a precursor powder becoming aluminum oxide upon thermal decomposition, to obtain a second raw material powder, and weighing and mixing the first raw material powder and the second raw material powder to give the α-sialon composition above, thereby obtaining a mixed powder.

In one example, the above-described production method of an oxynitride phosphor comprising an α-sialon as the main component is provided, wherein:

the first step is a step of firing a mixed powder comprising at least one kind of a europium compound powder selected from a europium nitride powder, a europium oxynitride powder, a europium oxide powder and a precursor powder becoming europium oxide upon thermal decomposition, and a silicon nitride powder at 1,400 to 1,800° C. in a nitrogen-containing inert gas atmosphere to obtain a first raw material powder, and the second step is a step of adding:

at least one kind of an aluminum compound powder selected from the group consisting of an aluminum nitride powder, an aluminum oxynitride powder, an aluminum oxide powder and a precursor powder becoming aluminum oxide upon thermal decomposition, at least one kind of a calcium compound powder selected from a calcium nitride powder, a calcium oxynitride powder, a calcium oxide powder and a precursor powder becoming calcium oxide upon thermal decomposition, and at least one kind of a lithium compound powder selected from a lithium oxide powder and a precursor powder becoming lithium oxide upon thermal decomposition, to the first raw material powder, and weighing and mixing these to give an α-sialon composition represented by the formula: $Li_xCa_{x'}Si_{12-(m+n)}Al_{(m+n)}O_nN_{16-n}$:$Eu_y$ (wherein $0.3 \leq x'+x''+y<1.5$, $0<y<0.7$, $0.3 \leq m<4.5$, $0<n<2.25$, and assuming that the atomic valence of europium Eu is b, $m=x'+2x''+by$), thereby obtaining a mixed powder.

In one example, the above-described production method of an oxynitride phosphor comprising an α-sialon as the main component is provided, wherein:

the first step is a step of firing a mixed powder comprising:

at least one kind of a europium compound powder selected from a europium nitride powder, a europium oxynitride powder, a europium oxide powder and a precursor powder becoming europium oxide upon thermal decomposition, at least one kind of a lithium compound powder selected from a lithium oxide powder and a precursor powder becoming lithium oxide upon thermal decomposition, and a silicon nitride powder, at 1,400 to 1,800° C. in a nitrogen-containing inert gas atmosphere to obtain a first raw material powder, and the second step is a step of mixing:

at least one kind of an aluminum compound powder selected from the group consisting of an aluminum nitride powder, an aluminum oxynitride powder, an aluminum oxide powder and a precursor powder becoming aluminum oxide upon thermal decomposition, and at least one kind of a calcium compound powder selected from the group consisting of a calcium nitride powder, a calcium oxynitride powder, a calcium oxide powder and a precursor powder becoming calcium oxide upon thermal decomposition, to obtain a second raw material powder, and weighting and mixing the first raw material powder and the second raw material powder to give an α-sialon composition represented by the formula: $Li_xCa_{x'}Si_{12-(m+n)}Al_{(m+n)}O_nN_{16-n}$:$Eu_y$ (wherein $0.3 \leq x'+x''+y<1.5$, $0<y<0.7$, $0.3 \leq m<4.5$, $0<n<2.25$, and assuming that the atomic valence of europium Eu is b, $m=x'+2x''+by$), thereby obtaining a mixed powder.

In one example, the above-described production method of an oxynitride phosphor comprising an α-sialon as the main component is provided, wherein:

the first step is a step of firing a mixed powder comprising:

at least one kind of a europium compound powder selected from a europium nitride powder, a europium oxynitride powder, a europium oxide powder and a precursor powder becoming europium oxide upon thermal decomposition, at least one kind of a calcium compound powder selected from a calcium nitride powder, a calcium oxynitride powder, a calcium oxide powder and a precursor powder becoming calcium oxide upon thermal decomposition, a lithium oxide powder or a precursor powder becoming lithium oxide upon thermal decomposition, and a silicon nitride powder, at 1,400 to 1,800° C. in a nitrogen-containing inert gas atmosphere to obtain a first raw material powder, and the second step is a step of:

mixing at least two kinds of aluminum compound powders selected from an aluminum nitride powder, an aluminum oxynitride powder, an aluminum oxide powder and a precursor powder becoming aluminum oxide upon thermal decomposition to obtain a second raw material powder, and weighting and mixing the first raw material powder and the second raw material powder to give an α-sialon composition represented by the formula:

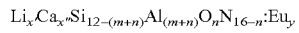

$Li_{x'}Ca_{x''}Si_{12-(m+n)}Al_{(m+n)}O_nN_{16-n}:Eu_y$ (wherein $0.3 \leq x'+x''+y < 1.5$, $0 < y < 0.7$, $0.3 \leq m < 4.5$, $0 < n < 2.25$, and assuming that the atomic valence of europium Eu is b, $m = x'+2x''+by$), thereby obtaining a mixed powder.

In one example, the above-described production method of an oxynitride phosphor comprising an α-sialon as the main component is provided, wherein the silicon nitride powder is at least one kind of a silicon nitride powder selected from a nitrogen-containing silane compound, an amorphous silicon nitride and a crystalline silicon nitride.

In one example, the above-described production method of an oxynitride phosphor comprising an α-sialon as the main component is provided, wherein the silicon nitride powder is a mixture of two or more kinds of silicon nitride powders selected from a nitrogen-containing silane compound, an amorphous silicon nitride and a crystalline silicon nitride.

In one example, the above-described production method of an oxynitride phosphor comprising an α-sialon as the main component is provided, wherein the oxynitride phosphor comprising an α-sialon as the main component obtained by firing is acid-washed to remove the excessive glass phase.

We also provide, as means to attain the above-described objects, a lighting device comprising an emission light source and the oxynitride phosphor above comprising an α-sialon as the main component, the phosphor being represented by the formula: $M_xSi_{12-(m+n)}Al_{(m+n)}O_nN_{16-n}:Ln_y$.

In one example, the above-described lighting device comprising an emission light source and an oxynitride phosphor comprising an α-sialon as the main component is provided, wherein the emission light source is LED of emitting light at a wavelength of 330 to 500 nm.

Furthermore, we provide, as means to attain the above-described objects, an image display device comprising an excitation source and the oxynitride phosphor above comprising an α-sialon as the main component, the phosphor being represented by the formula: $M_xSi_{12-(m+n)}Al_{(m+n)}O_nN_{16-n}:Ln_y$.

In one example, the above-described image display device comprising an excitation source and an oxynitride phosphor comprising an α-sialon as the main component is provided, wherein the excitation source is an electron beam, an electric field, a vacuum ultraviolet ray or an ultraviolet ray.

In one example, the above-described image display device comprising an excitation source and an oxynitride phosphor comprising an α-sialon as the main component is provided, wherein the image display device is any one of a fluorescent display tube (VFD), a field emission display (FED), a plasma display panel (PDP) and a cathode ray tube (CRT).

According to the disclosure, a sialon-based oxynitride phosphor extremely reduced in the aggregation of primary particles and excellent in miscibility with a resin and dispersibility in a resin is obtained. This phosphor excellent in miscibility with a resin and dispersibility in a resin has characteristic features such as little scattering of incident light, uniform fluorescent property, no color unevenness, stable color tone and high emission intensity. According to the production method of a sialon-based oxynitride phosphor, the method has a first step where a mixed powder obtained by previously adding at least one kind of a metal compound selected from a nitride, an oxynitride, an oxide or a precursor substance becoming an oxide upon thermal decomposition, of a metal M (M is at least one metal selected from the group consisting of Li, Ca, Mg, Ba, Sr, Y and a lanthanide metal excluding La, Ce, Pr, Eu, Dy, Er, Tb and Yb) solid-dissolved in an α-sialon, and a nitride, an oxynitride, an oxide or a precursor substance becoming an oxide upon thermal decomposition, of a lanthanide metal Ln (Ln is at least one lanthanide metal selected from the group consisting of Ce, Pr, Eu, Dy, Er, Tb and Yb) substituting a part or all of the metal element M to work as a luminescence center, to a silicon nitride powder is fired at 1,400 to 1,800° C. in a nitrogen-containing inert gas atmosphere to obtain a first raw material powder, so that the above-described a sialon-based oxynitride phosphor having high dispersibility can be obtained in a high yield.

Furthermore, a lighting device such as a white LED fabricated by combining the sialon-based oxynitride phosphor with blue LED or violet LED is uniform and stable in the brightness and color tone and is excellent in view of performance, because high-quality light free of color unevenness is obtained. As for the advantage in view of production, by virtue of use of the sialon-based oxynitride phosphor, the fluctuation of quality within and among the lots of the white LED product is small and the yield of the product is high.

BRIEF DESCRIPTION OF THE DRAWINGS

In FIG. 3, 1 indicates a light-transparent resin containing a phosphor, 2 indicates a blue LED chip, 3 indicates a gold wire, 4 indicates a molded package, and 5 indicates a lead electrode.

DETAILED DESCRIPTION

Figure 1:
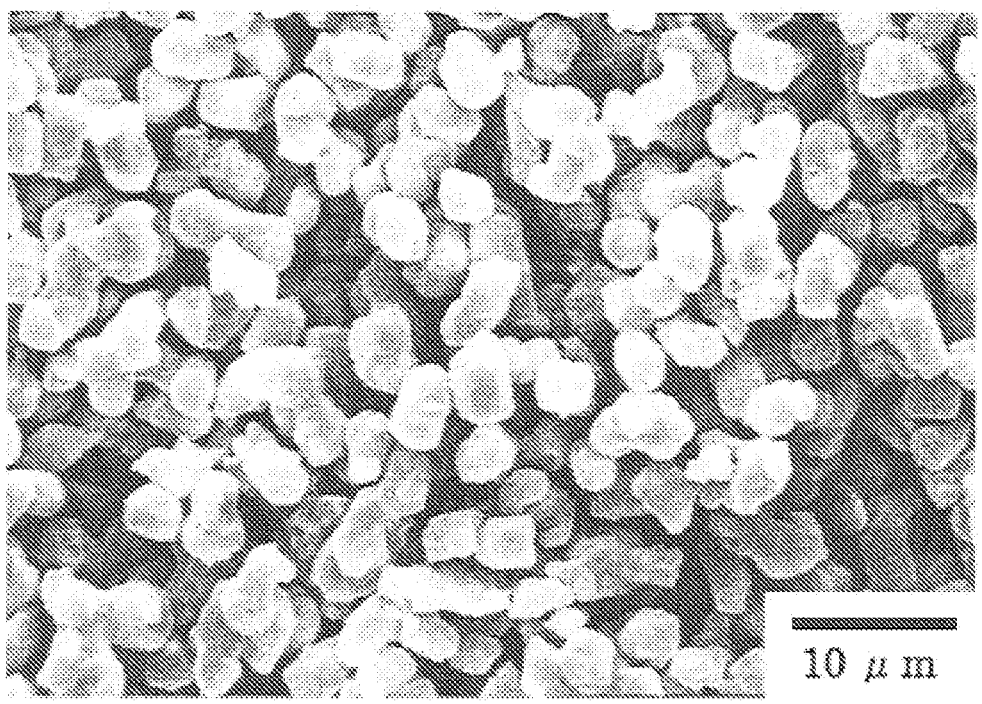
FIG. 1 is a scanning electron micrograph illustrating the particle form of the α-sialon-based oxynitride phosphor obtained in Example 9.

The disclosure is described in detail below. The α-sialon is a sialon where a predetermined amount of a metal M is solid-dissolved in a compound having a composition composed of Si, Al, O and N, represented by the following Formula (1):

$$M_xSi_{12-(m+n)}Al_{(m+n)}O_nN_{16-n}:Ln_y \quad (1)$$

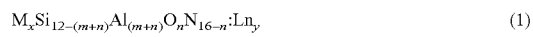

(wherein $0.3 \leq x+y < 1.5$, $0 < y < 0.7$, $0.3 \leq m < 4.5$, and $0 < n < 2.25$), and a part or all of the metal M solid-dissolved is substituted by a lanthanide metal Ln working as a luminescence center.

The oxynitride phosphor is a phosphor comprising the α-sialon above as the main component.

The metal M solid-dissolved is at least one metal selected from the group consisting of Li, Ca, Mg, Ba, Sr, Y and a lanthanide metal excluding La, Ce, Pr, Eu, Dy, Er, Tb and Yb, and the lanthanide metal Ln working as a luminescence center is at least one lanthanide metal selected from Ce, Pr, Eu, Dy, Er, Tb and Yb. In Formula (1), assuming that the atomic valence of the metal M is a and the atomic valence of the lanthanide metal Ln is b, m=ax+by. ***

In Formula (1), factors m and n are $0.3 \leq m < 4.5$ and $0 < n < 2.25$. If m and n deviate from these ranges, an α-sialon becomes difficult to form and this is not preferred. The value of m is preferably $0.5 < m < 2.5$, and the value of n is preferably $0.5 < n \leq 1.25$, more preferably $1.0 \leq n \leq 1.25$. If n is less than 0.5, the emission intensity of the phosphor decreases, whereas if n exceeds 1.25, fusion bonding or aggregation of phosphor particles aggressively proceeds. There is a tendency that when the value of factor n in Formula (1) becomes large, the light emission spectrum of the obtained phosphor shifts to the short wavelength side, whereas when the value of factor n becomes small, the light emission spectrum of the obtained phosphor shifts to the long wavelength side.

Similarly, there is a tendency that when the value of factor (m+n) in Formula (1) becomes large, the light emission spectrum of the obtained phosphor shifts to the short wavelength side, whereas when the value of factor (m+n) becomes small, the light emission spectrum of the obtained phosphor shifts to the long wavelength side.

For example, a phosphor using Ca as the metal M solid-dissolved in the α-sialon-based oxynitride phosphor and Eu as the lanthanide metal Ln emits light of yellow color (wavelength: approximately from 560 to 590 nm) and has an optimal color tone for obtaining white LED. Furthermore, when the value of factor (m+n) in Formula (1) becomes large, the peak wavelength of the light emission spectrum of the obtained phosphor shifts to the short wavelength side (550 nm), whereas when the value of factor (m+n) becomes small, the peak wavelength of the light emission spectrum of the obtained phosphor shifts to the long wavelength side (600 nm).

The aggregation index, $A_1 = D_{50}/D_{BET}$, defined as the ratio between the median diameter $D_{50}$ [μm] in the particle size distribution curve of the α-sialon-based oxynitride phosphor and the equivalent-sphere diameter $D_{BET}$ [μm] calculated on the basis of the BET specific surface area is 3.0 or less. If $A_1$ exceeds 3.0, aggregation or fusion bonding of particles aggressively proceeds and when used as a phosphor for white LED or the like, a large quantity of incident light is scattered and this disadvantageously causes a problem such as reduction in the absorbance or production of color unevenness in the obtained light emission. As for the phosphor particle, a monodisperse equiaxial particle is preferred.

In this disclosure, the "particle size distribution curve" is obtained by using a in-liquid dispersion sample prepared in accordance with JIS Z8820 and converting the distribution of weight-basis particle diameters measured by laser diffraction/scattering method into a sub-sieve integrated distribution curve, and the "median diameter $D_{50}$" indicates a particle diameter corresponding to the cumulative percentage of 50% in the particle size distribution curve.

The equivalent-sphere diameter is a particle diameter assuming that the powder is composed of a sphere equal in the diameter, and this is a physical value generally employed in the field of powder engineering. Since the volume V of a sphere having a diameter of d is expressed by $\pi d^3/6$ and the surface area S is expressed by $\pi d^2$, the ratio of the surface area S to the volume V becomes $S/V = 6/d$. The BET specific surface area $S_{BET}$ [m²/g] is a surface area per powder of unit weight and therefore, assuming that the density of the powder is ρ [g/cm³], the relational expression between the BET specific surface area $S_{BET}$ and the equivalent-sphere diameter $D_{BET}$ [μm] becomes:

$$10^6 \cdot \rho \cdot S_{BET} = 6/(D_{BET} \cdot 10^{-6})$$

From this, $D_{BET}$ is calculated as:

$$D_{BET} = 6/(\rho \cdot S_{BET})$$

As regards the aggregation index, $A_2 = D_{50}/D_{particle}$, defined as the ratio between the median diameter $D_{50}$ [μm] in the particle size distribution curve and the primary particle diameter $D_{particle}$ [μm] measured by the image analysis of a scanning electron micrograph, similarly, if $A_2$ exceeds 3.0, aggregation or fusion bonding of particles aggressively proceeds and when used as a phosphor for white LED or the like, a large quantity of incident light is scattered and this disadvantageously causes a problem such as reduction in the absorbance or production of color unevenness in the obtained light emission.

The primary particle diameter $D_{particle}$ of the α-sialon-based oxynitride phosphor measured by the image analysis of a scanning electron micrograph is preferably 8 μm or less, more preferably from 1 to 6 μm. The equivalent-sphere diameter $D_{BET}$ calculated on the basis of the BET specific surface area is also preferably 8 μm or less, more preferably from 1 to 6 μm.

Not only the particle diameter of the primary particle but also the particle diameter of the secondary particle need to be highly controlled. The median diameter in the particle size distribution curve of the α-sialon-based oxynitride phosphor is preferably 8 μm or less, more preferably from 1 to 6 μm. If the primary particle diameter or median diameter exceeds 8 μm, when a kneaded product with a light-transparent resin such as epoxy resin or acrylic resin is coated on a light-emitting diode (LED) to produce a lighting device such as white LED, fluctuation is produced in the emission intensity and color tone. Furthermore, in the α-sialon-based oxynitride phosphor, the dispersity $d_{90}/d_{10}$ defined as the ratio between 10% diameter ($d_{10}$) and 90% diameter ($d_{90}$) in the particle size distribution is preferably 4.0 or less. By controlling the $d_{90}/d_{10}$ ratio to 4.0 or less, a lighting device or an image display device realizing a uniform and good emission output and having a desired color tone can be obtained.

The production method of an α-sialon-based oxynitride phosphor is described below.

A first raw material powder is obtained in a first step of firing a mixed powder obtained by adding at least one kind of a metal compound selected from:

a nitride, an oxynitride, an oxide or a precursor substance becoming an oxide upon thermal decomposition, of a metal M (M is at least one metal selected from the group consisting of Li, Ca, Mg, Ba, Sr, Y and a lanthanide metal excluding La, Ce, Pr, Eu, Dy, Er, Tb and Yb) solid-dissolved in an α-sialon represented by the formula: $M_x Si_{12-(m+n)} Al_{(m+n)} O_n N_{16-n}$: $Ln_y$, and a nitride, an oxynitride, an oxide or a precursor substance becoming an oxide upon thermal decomposition, of a lanthanide metal Ln (Ln is at least one lanthanide metal selected from the group consisting of Ce, Pr, Eu, Dy, Er, Tb and Yb) substituting a part or all of the metal element M to work as a luminescence center, to a silicon nitride powder, at 1,400 to 1,800° C. in a nitrogen-containing inert gas atmosphere.

In the case where the objective sialon-based phosphor is $Li_xCa_{x''}Si_{12-(m+n)}Al_{(m+n)}O_nN_{16-n}$:$Eu_y$ (wherein 0.3≤x'+x"+y<1.5, 0<y<0.7, 0.3≤m<4.5 and 0<n<2.25), a mixed powder obtained by adding and mixing at least one kind of a metal compound selected from the group consisting of:

europium nitride (EuN), europium oxynitride (Eu(O,N)), europium oxide ($Eu_2O_3$) or a precursor substance becoming europium oxide upon thermal decomposition, a calcium nitride powder, a calcium oxynitride powder, a calcium oxide powder (CaO) or a precursor substance becoming calcium oxide upon thermal decomposition, and lithium oxide ($Li_2O$) or a precursor substance becoming lithium oxide upon thermal decomposition, to a silicon nitride powder, is fired at 1,400 to 1,800° C. to obtain a first raw material powder.

The europium oxide powder when fired at high temperature in a nitrogen atmosphere is reduced into divalent oxide (EuO) and becomes a light emission source.

The lithium oxide powder promotes the generation of a nucleus for the production of an α-sialon crystal and by being solid-dissolved in the crystal lattice, accelerates the production of an α-sialon phase as well as the resultant invasion and solid-dissolution of Eu atom to raise the emission intensity.

As for the blending composition of the first raw material powder, lithium oxide ($Li_2O$) or a precursor becoming lithium oxide upon thermal decomposition is preferably contained. In the case of not containing a substance working as a Li source, a number of aggregated particles or fused particles are produced and the effects of the production method tend to be disadvantageously decreased.

The calcium oxide powder is solid-dissolved in an α-sialon crystal lattice to expand the lattice spacing of the α-sialon phase and along the expansion of the lattice, the amount of Eu atom invaded and solid-dissolved is increased to raise the emission intensity.

Blending of raw material substances for obtaining the first raw material powder is performed by charging respective raw material substances and a grinding medium into a mixing vessel and grinding and mixing these for 0.25 to 2 hours in a grinder such as ball mill or vibration mill.

The firing in the first step is performed in a nitrogen-containing inert gas atmosphere, preferably in a nitrogen atmosphere. As for the firing conditions when using a nitrogen-containing silane compound and/or an amorphous silicon nitride powder-containing silicon nitride powder, the firing is performed at a crystallization initiating temperature in a range of 1,150° C. to 1,250° C. while slowly raising the temperature at a temperature rise rate of approximately from 10 to 100° C./hour to 1,400 to 1,800° C., whereby a fired powder of equiaxial crystal mainly comprising a crystalline silicon nitride and/or a silicon nitride-containing composite nitride, in the form of primary particles being dispersed, can be obtained.

If the temperature rise rate is less than 10° C./hour, firing requires a long time and the productivity decreases, whereas if it exceeds 100° C., a powder containing a needle-like crystal or a hazy aggregated or fused particle is disadvantageously obtained after the firing.

The fired powder in the first step is passed through a sieve having an opening of 350 to 590 μm for obtaining a good mixed state with a second raw material and then used as the first raw material powder.

In the second step, at least one kind of a metal compound selected from the group consisting of:

a nitride, an oxynitride, an oxide or a precursor substance becoming an oxide upon thermal decomposition, of the metal M, a nitride, an oxynitride, an oxide or a precursor substance becoming an oxide upon thermal decomposition, of the lanthanide metal Ln substituting a part or all of the metal element M and working out to the center of light emission, an aluminum nitride powder and an aluminum oxide powder, is added to the first raw material powder, and these are weighed and mixed to give an α-sialon composition represented by the formula: $M_xSi_{12-(m+n)}Al_{(m+n)}O_nN_{16-n}$:$Ln_y$, whereby a mixed powder having a desired composition is obtained.

In the case where the objective sialon-based phosphor is $Li_xCa_{x''}Si_{12-(m+n)}Al_{(m+n)}O_nN_{16-n}$:$Eu_y$ (wherein 0.3≤x'+x"+y<1.5, 0<y<0.7, 0.3≤m<4.5 and 0<n<2.25), at least one kind of a metal compound selected from the group consisting of:

europium nitride (EuN), europium oxynitride (Eu(O,N)), europium oxide ($Eu_2O_3$) or a precursor substance becoming europium oxide upon thermal decomposition, calcium nitride ($Ca_3N_2$), calcium oxynitride (Ca(O,N)), calcium oxide (CaO) or a precursor substance becoming calcium oxide upon thermal decomposition, lithium oxide ($Li_2O$) or a precursor substance becoming lithium oxide upon thermal decomposition, an aluminum nitride powder and/or an aluminum oxide powder is added to the first raw material powder, and these are weight and mixed to give an α-sialon composition represented by the formula: $Li_xCa_{x''}Si_{12-(m+n)}Al_{(m+n)}O_nN_{16-n}$:$Eu_y$, whereby a mixed powder having a desired composition is obtained.

In the third step, the obtained mixed powder is filled in a silicon nitride-made crucible and fired at 1,500 to 2,000° C. As for the firing atmosphere, the firing is performed in a nitrogen-containing inert gas atmosphere, preferably a nitrogen atmosphere, but a slight amount of hydrogen, ammonia, hydrocarbon (e.g., methane, ethane) or carbon monoxide may be flowed.

In another example of the production method of an α-sialon-based oxynitride phosphor, a first raw material powder is obtained by employing the same first step as in the production method above.

In the second step, at least one kind of a metal compound selected from the group consisting of:

a nitride, an oxynitride, an oxide or a precursor substance becoming an oxide upon thermal decomposition, of the metal M solid-dissolved in the α-sialon represented by the formula above, and a nitride, an oxynitride, an oxide or a precursor substance becoming an oxide upon thermal decomposition, of the lanthanide metal Ln substituting a part or all of the metal element M to work as a luminescence center, is mixed together with at least one kind of an aluminum compound powder selected from an aluminum nitride powder, an aluminum oxynitride powder, an aluminum oxide powder and a precursor powder becoming aluminum oxide upon thermal decomposition to obtain a second raw material powder, and the first raw material powder and the second raw material powder are weighed and mixed to give an α-sialon composition represented by the formula: $M_xSi_{12-(m+n)}Al_{(m+n)}O_nN_{16-n}$:$Ln_y$, whereby a mixed powder having a desired composition.

In the case where the objective sialon-based phosphor is $Li_xCa_{x''}Si_{12-(m+n)}Al_{(m+n)}O_nN_{16-n}$:$Eu_y$ (wherein 0.3≤x'+x"+y<1.5, 0<y<0.7, 0.3≤m<4.5 and 0<n<2.25), as for blending of the raw materials in the second step, at least one kind of a metal compound selected from the group consisting of:

europium nitride (EuN), europium oxynitride (Eu(O,N)), europium oxide (Eu$_2$O$_3$) or a precursor substance becoming europium oxide upon thermal decomposition, calcium nitride (Ca$_3$N$_2$), calcium oxynitride (Ca(O,N)), calcium oxide (CaO) or a precursor substance becoming calcium oxide upon thermal decomposition, and lithium oxide (Li$_2$O) or a precursor substance becoming lithium oxide upon thermal decomposition, and a substance working as an aluminum source are charged into a mixing vessel together with a grinding medium, and these are ground and mixed for 0.25 to 2 hours by using a grinder such as ball mill or vibration mill.

If the grinding and mixing time is less than 0.25 hours, mixing becomes insufficient and this gives rise to reduction in the emission intensity of the obtained sialon-based oxynitride phosphor, whereas if the grinding and mixing time exceeds 2 hours, the mixed amount of the grinding medium increases.

The atmosphere at the time of weighting and mixing the raw material powders used in the second step may be an air atmosphere but when the humidity is high, care needs to be taken, because a part of aluminum nitride is hydrolyzed or oxidized to increase the oxygen concentration in the raw material powder and, as a result, the production ratio of an aggregated particle or a fused particle increases.

The thus-prepared mixed powder is used as a second raw material powder after passing the mixed powder through a sieve having an opening of 350 to 590 μm for obtaining a good mixed state with the first raw material. The obtained first and second raw material powders are weighed and mixed to give an α-sialon composition represented by Li$_x$Ca$_{x'}$Si$_{12-(m+n)}$Al$_{(m+n)}$O$_n$N$_{16-n}$:Eu$_y$, whereby a mixed powder having a desired composition is obtained.

In the third step, the obtained mixed powder is filled in a silicon nitride-made crucible and fired at 1,500 to 2,000° C. As for the firing vessel, a graphite-made crucible, a silicon carbide-made crucible, and a boron nitride-made crucible may be used, other than a silicon nitride-made crucible. In the case of a graphite-made crucible, the inner wall is preferably coated with silicon nitride, boron nitride or the like.

As for the firing atmosphere, the firing is performed in a nitrogen-containing inert gas atmosphere at 1 atm. The firing may be performed in a nitrogen-containing inert gas atmosphere under pressure. The firing is preferably performed in a nitrogen atmosphere, but a slight amount of hydrogen, ammonia, hydrocarbon (e.g., methane, ethane) or carbon monoxide may be flowed.

The firing temperature in a nitrogen atmosphere at 1 atm is from 1,500 to 1,800° C., preferably from 1,550 to 1,750° C. If the firing temperature is less than 1,500° C., heating for a long time is necessary for the production of a desired α-sialon-based oxynitride powder and this is not practical. Also, the production ratio of an α-sialon phase in the produced powder decreases. In a nitrogen atmosphere at 1 atm, if the temperature exceeds 1,800° C., silicon nitride and sialon are sublimated and decomposed and free silicon is disadvantageously produced. If the firing time is less than 1 hour, the emission intensity of the obtained sialon-based oxynitride phosphor is low, whereas if the firing time is excessively long, productivity is bad. The proportion of a fused particle or a coarse particle tends to increase.

On the other hand, in a nitrogen gas atmosphere under pressure, the firing may be performed in a temperature range of 1,600 to 2,000° C., preferably from 1,600 to 1,900° C. In this case, the sublimation and decomposition of silicon nitride and sialon at a high temperature are suppressed due to pressurization of nitrogen gas, and a desired α-sialon based phosphor can be obtained in a short time. The firing temperature may be elevated by raising the nitrogen gas pressure and, for example, the powder mixture can be fired at 1,600 to 1,850° C. under nitrogen gas pressure of 5 atm and at 1,600 to 2,000° C. under nitrogen gas pressure of 50 atm.

In still another example of the production method of an α-sialon-based oxynitride phosphor, in the first step, a mixed powder obtained by adding:

at least one kind of a metal M compound selected from a nitride, an oxynitride, an oxide and a precursor substance becoming an oxide upon thermal decomposition, of a metal M (M is at least one metal selected from the group consisting of Li, Ca, Mg, Ba, Sr, Y and a lanthanide metal excluding La, Ce, Pr, Eu, Dy, Er, Tb and Yb) solid-dissolved in an α-sialon represented by the formula:

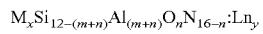
$$M_xSi_{12-(m+n)}Al_{(m+n)}O_nN_{16-n}:Ln_y$$

(wherein 0.3≤x+y<1.5, 0<y<0.7, 0.3≤m<4.5, 0<n<2.25, and assuming that the atomic valence of the metal M is a and the atomic valence of the lanthanide metal Ln is b, m=ax+by), and at least one kind of a metal Ln compound selected from a nitride, an oxynitride, an oxide and a precursor substance becoming an oxide upon thermal decomposition, of a lanthanide metal Ln (Ln is at least one lanthanide metal selected from the group consisting of Ce, Pr, Eu, Dy, Er, Tb and Yb) substituting a part or all of the metal element M to work as a luminescence center, to a silicon nitride powder is fired at 1,400 to 1,800° C. in a nitrogen-containing inert gas atmosphere to obtain a first raw material powder.

In the case where the objective sialon-based phosphor is Li$_x$Ca$_{x'}$Si$_{12-(m+n)}$Al$_{(m+n)}$O$_n$N$_{16-n}$:Eu$_y$ (wherein 0.3≤x'+x"+y<1.5, 0<y<0.7, 0.3≤m<4.5 and 0<n<2.25), at least one kind of a europium compound selected from europium nitride (EuN), europium oxynitride (Eu(O,N)), europium oxide (Eu$_2$O$_3$) and a precursor substance becoming europium oxide upon thermal decomposition, at least one kind of a calcium compound selected from calcium nitride (Ca$_3$N$_2$), calcium oxynitride (Ca(O,N)), calcium oxide (CaO) and a precursor substance becoming calcium oxide upon thermal decomposition, lithium oxide (Li$_2$O) or a precursor substance becoming lithium oxide upon thermal decomposition, and a silicon nitride powder are charged into a mixing vessel together with a grinding medium and these are ground an mixed for 0.25 to 2 hours by using a grinder such as ball mill and vibration mill.

If the grinding and mixing time is less than 0.25 hours, the mixing is insufficient and this gives rise to reduction in the emission intensity of the obtained sialon-based oxynitride phosphor, whereas if the grinding and mixing time exceeds 2 hours, the mixed amount of the grinding medium increases.

In the second step, an aluminum nitride powder or an aluminum oxynitride powder is added to the first raw material powder, and these powders are weighed and mixed to give an α-sialon composition represented by the formula: M$_x$Si$_{12-(m+n)}$Al$_{(m+n)}$O$_n$N$_{16-n}$:Ln$_y$, whereby a mixed powder having a desired composition is obtained.

In the case where the aluminum compound added in the second step is two or more kinds of aluminum compound powders selected from the group consisting of an aluminum nitride powder, an aluminum oxynitride powder, an aluminum oxide powder and a precursor powder becoming aluminum oxide upon thermal decomposition, a mixed powder is obtained by previously mixing two or more kinds of selected aluminum compound powders to obtain a first second raw material, and weighing and mixing the first raw material powder and the second raw material powder to give the α-sialon composition above.

The atmosphere at the time of weighting and mixing the raw material powders used in the second step may be an air atmosphere but when the humidity is high, care needs to be taken, because a part of aluminum nitride is hydrolyzed or oxidized to increase the oxygen concentration in the raw material powder and, as a result, the production ratio of an aggregated particle or a fused particle increases.

The fired powder obtained in the third step is acid-treated using a mineral acid to remove the excessive glass phase. For example, 0.1 to 6 N nitric acid is added and the powder is stirred for 1 to 10 hours, whereby the excessive glass phase is eluted and removed. If the nitric acid concentration is less than 0.1 N, the elution of the glass phase is insufficient and the emission intensity of the obtained phosphor decreases, whereas if it exceeds 6 N, the treatment becomes excessive and the cost for waste treatment and the like disadvantageously rises. As for the mineral acid, sulfuric acid, hydrochloric acid, hydrofluoric acid or a mixed solution of these mineral acids is used, other than nitric acid.

The slurry after acid treatment is subjected to water washing, wet sieving, filtration and dried, whereby an α-sialon-based oxynitride powder having a desired particle size is obtained. The drying is performed, for example, at 120° C.

As for the substance working as an aluminum source, any one of an aluminum nitride (AlN) powder alone, a mixed powder of AlN and aluminum (Al), and a mixed powder of an AlN powder and an aluminum oxide or a precursor substance becoming an oxide of aluminum upon thermal decomposition is used and added as an aluminum nitride source and/or aluminum oxide source necessary for the production of an α-sialon.

Examples of the precursor substances becoming an oxide of a metal M, becoming an oxide of a lanthanide metal Ln and becoming an oxide of aluminum upon thermal decomposition include a hydroxide, a carbonate, an ammonium hydrogen carbonate, a nitrate and an alkoxide of each element, and these are each used in a powder state.

Specifically, examples of the precursor substance becoming lithium oxide upon thermal decomposition include lithium carbonate ($Li_2CO_3$), lithium hydroxide (LiOH) and lithium nitrate ($LiNO_3$).

Examples of the precursor substance becoming calcium oxide upon thermal decomposition include calcium carbonate ($CaCO_3$), calcium hydroxide ($Ca(OH)_2$), calcium nitrate ($Ca(NO_3)_2$) and calcium chloride ($CaCl_2$).

Examples of the precursor substance becoming aluminum oxide ($Al_2O_3$) upon thermal decomposition include aluminum hydroxide ($Al(OH)_3$) and an ammonium dawsonite salt of aluminum ($AACH(NH_4AlCO_3(OH)_2)$).

Examples of the precursor becoming an oxide of a lanthanide metal Ln upon thermal decomposition include, in the case of europium oxide ($Eu_2O_3$), $Eu_2(C_2O_4)_3$, $Eu(OH)_3$, $EuCl_3$, $Eu(NO_3)_3$.

The amount of the lithium carbonate powder added is preferably $0.03 \leq x' \leq 0.20$ in terms of the compositional ratio x' in $Li_{x'}Ca_{x''}Si_{12-(m+n)}Al_{(m+n)}O_nN_{16-n}:Eu_y$. If x' is less than 0.03, the effect of raising the emission intensity of the obtained sialon-based oxynitride phosphor becomes small, whereas if x' exceeds 0.20, the amount of oxygen carried over from the raw material such as lithium carbonate increases and the oxygen concentration of the obtained sialon-based oxynitride phosphor rises to bring about an increase in the proportion of a fused particle or an aggregated particle.

Examples of the nitrogen-containing silane compound include silicon diimide ($Si(NH)_2$), silicon tetraamide, silicon nitrogen imide and silicon chloroimide. These are produced by a known method, for example, a method of reacting a silicon halide such as silicon tetrachloride, silicon tetrabromide or silicon tetraiodide with ammonia in a gas phase, or a method of reacting the silicon halide above in a liquid form with liquid ammonia. As for the amorphous silicon nitride powder, those produced by a known method, for example, a method of thermally decomposing the nitrogen-containing silane compound above at a temperature of 600 to 1,200° C. in a nitrogen or ammonia gas atmosphere, or a method of reacting a silicon halide such as silicon tetrachloride, silicon tetrabromide or silicon tetraiodide with ammonia at a high temperature, are used. The average particle diameter of the amorphous silicon nitride powder and nitrogen-containing silane compound is usually from 0.005 to 0.05 μm.

The nitrogen-containing silane compound and amorphous silicon nitride powder are readily hydrolyzed or oxidized and therefore, these raw material powders each is weighed in an inert gas atmosphere. Mixing of raw material powders in the first step is performed in an inert gas atmosphere. In the case of mixing the raw material powders in an atmosphere containing moisture or oxygen, the nitrogen-containing silane compound or amorphous silicon nitride powder as a raw material is oxidized to raise the oxygen concentration in the raw material power, and the proportion of a fused particle or an aggregated particle in the obtained sialon-based oxynitride phosphor increases.

If the proportion of a crystalline component in the silicon nitride powder used as a raw material exceeds 95 wt %, the first raw material powder obtained in the first step is firmly fused to worsen the mixed state in the second step. Also, the sialon-based oxynitride powder obtained in the third step is firmly fused and is hard, and a strong grinding treatment is disadvantageously required.

As for the silicon nitride source, crystalline silicon nitride having a particle diameter of 0.1 to 10 μm may be used, but as the particle diameter of the crystalline silicon nitride is smaller, fuse bonding and sintering of the fired powder obtained in the first and third steps more proceeds, and the powder becomes hard and requires a grinding treatment for a long time.

In the case where the proportion of a crystalline component in the silicon nitride powder used as a raw material is from 5 to 95 wt %, the reactivity is high and a sialon powder can be produced with good efficiency by a normal powder firing method of mixing starting materials and firing the mixture in a crucible. However, the sialon powder obtained by this production method is mainly composed of an aggregated particle of 20 μm or more and for obtaining a phosphor powder having a desired particle size, a grinding treatment is still needed.

To solve this problem, the first raw material powder is preferably prepared in the first step by mixing at least one kind of a metal compound selected from a nitride, an oxynitride, an oxide or a precursor substance becoming an lanthanide metal Ln oxide upon thermal decomposition, of a lanthanide metal Ln, and a nitride, an oxynitride, an oxide or a precursor substance becoming a metal M oxide upon thermal decomposition, of a metal M (M is at least one metal selected from Li, Ca, Mg, Y and a lanthanide metal excluding La, Ce, Pr, Eu, Dy, Er, Tb and Yb), to a silicon nitride powder in which the proportion of crystalline silicon nitride is less than 5 wt % and the remaining is amorphous silicon nitride and/or nitrogen-containing silane compound, and firing the mixture at 1,400 to 1,800° C. in a nitrogen-containing inert gas atmosphere. When the proportion of crystalline silicon nitride is less than 5 wt %, this is advantageous in that a grinding treatment as a post-step is not necessary.

When the first raw material powder obtained in the first step is observed by a scanning electron microscope, the primary particles are in an almost monodisperse state and the number of aggregated particles and fused particles is very small.

On the other hand, if a substance working as an aluminum source is mixed in the first step, aggregation, fusion bonding and coarsening of the obtained sialon-based oxynitride phosphor proceed and this is not preferred because not only the production ratio of a particle having an undesired particle form increases but also the emission intensity decreases.

In a α-sialon-based oxynitride phosphor obtained according to a conventional technique by employing a production method of previously mixing all raw material powders at the same time and firing the mixture, the production ratio of a particle of less than 20 μm is less than 60 wt % and the emission intensity of a particle having a particle diameter of less than 20 μm is low. This is considered because the defect on the particle surface increases. If the particle diameter exceeds 20 μm, when applied to white LED, the emission intensity becomes extremely non-uniform due to aggregation of particles and this is not preferred. The α-sialon-based oxynitride phosphor has a characteristic feature that the production ratio of a particle having a particle diameter of 2 to 20 μm is 85 wt % or more, the aggregation is less allowed and moreover, the emission intensity of a particle having a particle diameter of 20 μm is high.

The method for mixing the first raw material powder and the second raw material powder is not particularly limited and there may be employed a method that is itself known, for example, a method of dry-mixing the powders, and a method of wet-mixing the powders in an inactive medium which does not substantially react with respective raw material substances, and then removing the solvent. As for the mixing device, a V-shaped mixer, a rocking mixer, a ball mill, a vibration mill, a medium stirring mill and the like may be suitably used. Respective raw material powders and a grinding medium are put in a vessel and ground and mixed for 0.25 to 2 hours by using a grinder such as ball mill or vibration mill. If the grinding and mixing time is less than 0.25 hours, the mixing is insufficient and this gives rise to reduction in the emission intensity of the obtained sialon phosphor, whereas if the grinding and mixing time exceeds 2 hours, the mixed amount of the grinding medium increases.

The heating furnace used for the firing in the first and third steps is not particularly limited, and there may be used, for example, a batch electric furnace using a high frequency induction heating system or resistance heating system, a rotary kiln, a fluidized kiln or a pusher type electric furnace.

The rare earth element-activated α-sialon-based phosphor may be kneaded with a transparent resin such as epoxy resin or acrylic resin by a known method to produce a coating agent, and a light-emitting diode surface-coated with the coating agent is used as a high-brightness lighting device such as white LED, or as an image display device using an excitation source such as electron beam.

EXAMPLES

This disclosure is described in greater detail below by referring to specific Examples.

For the measurement of the specific surface area, FlowSorb Model 2300 manufactured by Shimadzu Corp. was used. A sample was put into a cell and after deaeration treatment, a nitrogen gas was adsorbed and desorbed. The specific surface area was determined by a BET one-point method from the amount of gas desorbed.

For the measurement of the particle size distribution, a laser diffraction/scattering particle size distribution analyzer, Model LA-910, manufactured by Horiba Ltd. was used. The sample was uniformly dispersed in water by adding SN Dispersant 5468 produced by San Nopco Ltd. as a dispersant and using an ultrasonic bath at an output of 100 W. The liquid dispersion was poured in the analyzer, and the weight-basis particle diameter distribution was measured by laser diffraction/scattering method and converted into a sub-sieve integrated distribution curve. The refractive index of the α-sialon-based oxynitride particle was set to 1.28.

For the observation of the particle form, a scanning electron microscope, JSM T-220, manufactured by JEOL Ltd. was used. After applying vapor deposition of gold to the powder sample dispersed on the stage, the sample was loaded in the apparatus and the particle form was observed at a magnification of 1,000 to 3,000.

The scanning electron micrograph of the produced powder was image-analyzed to determine the primary particle diameter. At the image analysis, the outer profile of individual primary particles was decided, and a long axis diameter was determined from the direction wider in the width out of the outer profile of the particle, while determining a short axis diameter from the dimension on the narrower width side crossing with the long axis at right angles. The measurement of the long axis diameter and short axis diameter was performed for 500 or more particles. The majority of the produced powder were an equiaxial particle having an aspect ratio of less than 1.5 and therefore, the primary particle diameter was calculated as a geometric mean of short axis diameters and long axis diameters.

Example 1

Silicon diimide ($Si(NH)_2$) obtained by reacting silicon tetrachloride with ammonia at a temperature lower than room temperature was decomposed under heating at 700 to 1,200° C. to obtain silicon nitrogen imide ($Si_2N_2NH$) and/or amorphous silicon nitride powder. The metal impurity content of the silicon nitrogen imide ($Si_2N_2NH$) and/or amorphous silicon nitride powder was 10 ppm or less. A blend obtained by blending a compound(s) as a silicon nitride source(s) selected from nitrogen-containing silane compounds (silicon diimide ($Si(NH)_2$) and silicon nitrogen imide ($Si_2N_2NH$)), amorphous silicon nitride and crystalline silicon nitride to give a chemical composition shown in Table 1 was used as the silicon nitride raw material. A europium oxide ($Eu_2O_3$) powder, a lithium carbonate ($Li_2CO_3$) powder and a calcium carbonate ($CaCO_3$) powder were weighed and added to the silicon nitride raw material to give a chemical composition of $Si_{9.25}Eu_{0.15}Ca_{0.62}Li_{0.10}O_{0.89}N_{12.33}$ after firing, and these were mixed by a vibration mill for 25 minutes in a nitrogen atmosphere.

The mixed powder was filled in a silicon nitride-made crucible, the crucible was set in an electric furnace of resistance heating system, and the furnace was heated in a nitrogen gas atmosphere by a temperature-rising schedule of holding the furnace at from temperature to 1,150° C. for 2 hours and raising the temperature from 1,150° C. to 1,250° C. at 50° C./h and from 1,250° C. to 1,635° C. at 100° C./h and then held at 1,635° C. for 1 hour to effect firing, whereby a first raw material powder was obtained. The fired powder was observed by a scanning electron microscope, as a result, there was produced a powder where the primary particles each composed of an equiaxial crystal were dispersed and the number of aggregated particles and fused particles was extremely small. The first raw material was passed through a sieve with an opening of 350 μm.

Subsequently, an aluminum nitride (AlN) powder and an aluminum oxide ($Al_2O_3$) powder were weighed to give a chemical composition of $Al_{2.75}O_{0.18}N_{2.61}$ and mixed by a vibration mill for 35 minutes in an air atmosphere to obtain a second raw material powder. The second raw material powder was also passed through a sieve with an opening of 350 μm.

The first raw material powder and the second raw material powder each was weighed to give a chemical composition of $Ca_{0.62}Eu_{0.15}Li_{0.10}Si_{9.25}Al_{2.75}O_{1.07}N_{14.94}$ and make a total amount of 75 g, and these powders were put in a 1 liter-volume polyethylene-made vessel and mixed while rotating the vessel at a rotation number of 82 rpm for 3 minutes. The raw material powder obtained by mixing was filled in a silicon nitride-made crucible, the crucible was set in an electric furnace of resistance heating system, and the furnace was heated in a nitrogen gas atmosphere by a temperature-rising schedule of holding the furnace at from temperature to 1,200° C. for 2 hours and raising the temperature from 1,200° C. to 1,650° C. at 200° C./h and then held at 1,650° C. for 20 hours to effect firing. The resultant fired power was lightly crushed in a silicon nitride-made mortar, and 20 g of the α-sialon-based powder after crushing was put in a 250 ml-volume polyethylene-made vessel together with 205 g of an aqueous 1 N nitric acid solution and acid-treated while rotating the vessel at a rotation number of 102 rpm for 5 hours. The slurry after acid treatment was passed through a sieve with an opening of 10 μm, then washed with water, filtered and dried in a drier at a preset temperature of 120° C. for 6 hours.

The α-sialon-based powder obtained through the steps above was subjected to analysis of the chemical composition, observation of a particle form by an electron microscope, and evaluation of powder properties such as specific surface area and particle size distribution.

The scanning electron micrograph of the produced powder was image-analyzed to determine the primary particle diameter. At the image analysis, individual primary particles were decided on the outer profile, and a long axis diameter was determined from the direction wider in the width out of the outer profile of the particle, while determining a short axis diameter from the dimension on the narrower width side crossing with the long axis at right angles. The measurement of the long axis diameter and short axis diameter was performed for 500 or more particles. The majority of the produced powder were an equiaxial particle having an aspect ratio of less than 1.5 and therefore, the primary particle diameter was calculated as a geometric mean of short axis diameters and long axis diameters.

For evaluating the fluorescent properties of the obtained α-sialon-based powder, the excitation spectrum at a detection wavelength of 570 to 595 nm and the emission spectrum at an excitation wavelength of 450 nm were measured using a fluorescence measuring apparatus (FP-6500, manufactured by JASCO). The fluorescence property is shown in Table 2 by a relative value when the value of highest emission intensity (peak strength at 564 nm) of the emission spectrum by the same excitation wavelength of a commercially available YAG:Ce-based fluorescent material (P46Y3, produced by Kasei Optonix, Ltd.) is taken as 100.

Example 2

An α-sialon-based oxynitride phosphor was obtained by repeating the same operation as in Example 1, except that the blending ratio of the compound(s) working as a silicon nitride source(s) selected from nitrogen-containing silane compounds (silicon diimide ($Si(NH)_2$) and silicon nitrogen imide ($Si_2N_2NH$)), amorphous silicon nitride and crystalline silicon nitride and the firing conditions in the first and second steps were slightly changed. The conditions in the synthesis of the α-sialon-based oxynitride phosphor comprising first and second steps are shown in Table 1, and the powder properties and fluorescent properties of the obtained oxynitride phosphor are shown in Table 2.

Figure 2:
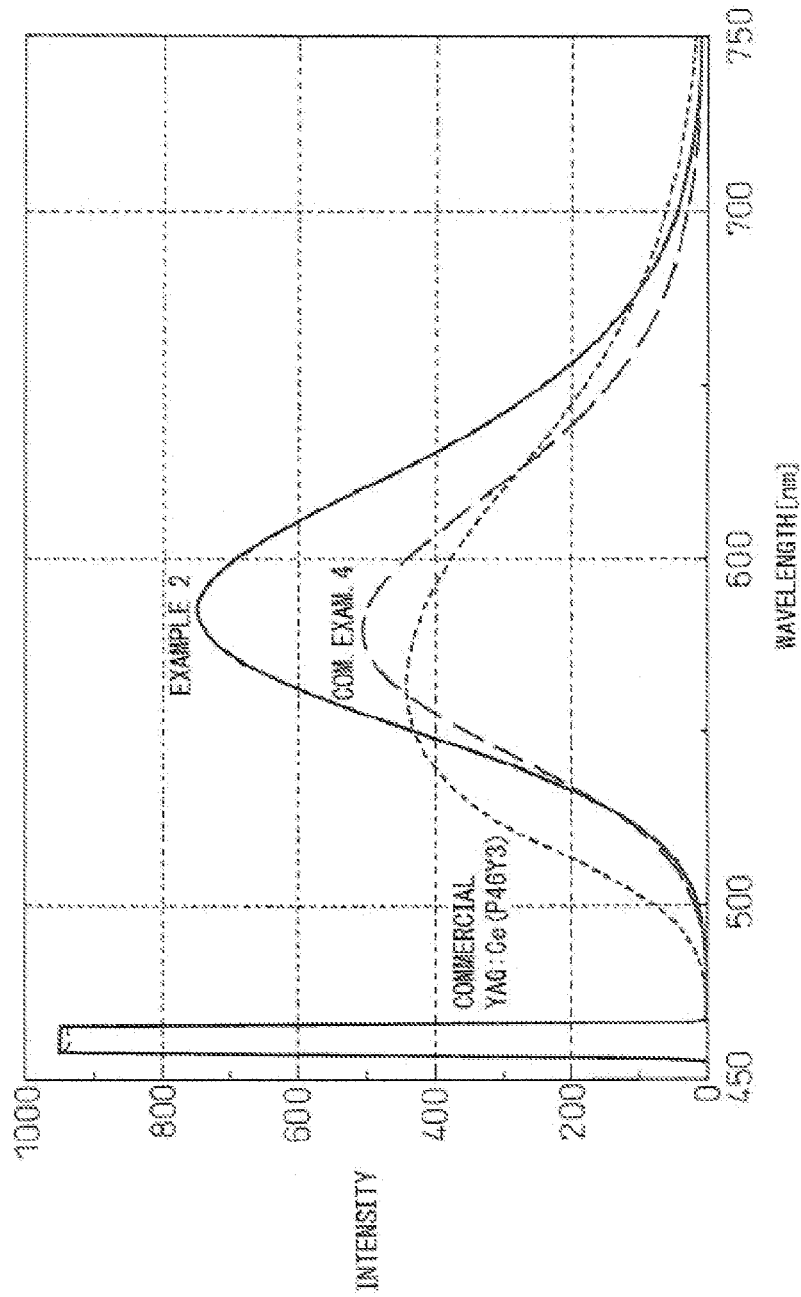
FIG. 2 is a view illustrating light emission spectrums of the α-sialon-based oxynitride phosphors obtained in Example 2 and Comparative Example 4.

FIG. 2 illustrates the emission spectrum at an excitation wavelength of 450 nm of the α-sialon-based oxynitride phosphor obtained in Example 2 together with the emission spectra of the α-sialon-based oxynitride phosphor obtained in Comparative Example 4 and a commercially available YAG:Ce-based fluorescent material (P46Y3, produced by Kasei Optonix, Ltd.).

Examples 3 to 15

Similarly to Example 1, those obtained by blending a compound(s) working as a silicon nitride source(s) selected from nitrogen-containing silane compounds (silicon diimide ($Si(NH)_2$) and silicon nitrogen imide ($Si_2N_2NH$)), amorphous silicon nitride and crystalline silicon nitride to give a chemical composition shown in Table 1 were used as the silicon nitride raw material. A europium oxide ($Eu_2O_3$) powder and a lithium oxide precursor powder were weighed and added to the silicon nitride raw material to give a chemical composition of $Si_{12-(m+n)}Eu_yLi_xO_{0.5x'+1.5y-\delta}N_{16-4(m+n)/3}$ (wherein $0 \leq \delta \leq 0.5y$), and these were mixed by a vibration mill under the conditions shown in Table 1 in a nitrogen atmosphere.

The mixed powder was filled in a silicon nitride-made crucible, the crucible was set in an electric furnace of resistance heating system, and the furnace was heated in a nitrogen gas atmosphere by a temperature-rising schedule of holding the furnace at from temperature to 1,150° C. for 2 hours and raising the temperature from 1,150° C. to 1,250° C. at 50° C./h and from 1,250° C. to a predetermined holding temperature at 100° C./h and then held under the conditions shown in Table 1 for 1 hour to effect firing, whereby a first raw material powder was obtained. The X-ray diffraction measurement of the fired powder revealed that the α-$Si_3N_4$ phase content was 94% or more. The fired powder was observed by a scanning electron microscope, as a result, there was produced a powder where the primary particles each composed of an equiaxial crystal were dispersed and the number of aggregated particles and fused particles was extremely small. The first raw material was passed through a sieve with an opening of 350 μm.

Subsequently, an aluminum nitride (AlN) powder, an aluminum oxide ($Al_2O_3$) powder and a calcium carbonate ($CaCO_3$) powder were weighed to give a predetermined chemical composition and mixed by a vibration mill under the conditions shown in Table 1 in an air atmosphere to obtain a second raw material powder. The second raw material powder was also passed through a sieve with an opening of 350 μm.

The first raw material powder and the second raw material powder each was weighed to be blended at a ratio giving a chemical composition of $Ca_{x'}Eu_yLi_xSi_{12-(m+n)}Al_{(m+n)}O_nN_{16-n}$ and make a total amount of 75 g, and these powders were put in a 1 liter-volume polyethylene-made vessel and mixed while rotating the vessel at a rotation number of 82 rpm for 3 minutes. The raw material powder obtained after mixing was fired by the same operation as in Example 1 under the conditions shown in Table 1. The resultant fired power was crushed, acid-treated, washed with water, filtered and dried in the same manner as in Example 1.

The chemical composition and evaluation results of powder properties and fluorescent properties of the α-sialon-based oxynitride powder obtained through the steps above are shown in Table 2. In the evaluation of fluorescent properties, the excitation spectrum at a detection wavelength of 570 to 595 nm and the emission spectrum at an excitation wavelength of 450 nm were measured using a fluorescence measuring apparatus (FP-6500, manufactured by JASCO).

FIG. 1 illustrates a scanning electron micrograph of the α-sialon-based oxynitride powder obtained in Example 9.

Example 16

An α-sialon-based oxynitride phosphor was obtained by repeating the same operation as in Example 1 except that in the raw material preparation of the first step, a europium oxide ($Eu_2O_3$) powder and a calcium carbonate ($CaCO_3$) powder were weighed and added to the silicon nitride raw material to give a chemical composition of $Si_{12-(m+n)}Eu_yCa_{x'}O_{x''+1.5y-\delta}N_{16-4(m+n)/3}$ after firing and these were mixed by a vibration mill for 45 minutes in a nitrogen atmosphere. The conditions in the synthesis of the α-sialon-based oxynitride phosphor comprising first and second steps are shown in Table 1, and the powder properties and fluorescent properties of the obtained oxynitride phosphor are shown in Table 2.

Example 17

An α-sialon-based oxynitride phosphor was obtained by repeating the same operation as in Example 1 except that in the raw material preparation of the second step, only an aluminum nitride (AlN) powder was used as the aluminum source. The conditions in the synthesis of the α-sialon-based oxynitride phosphor comprising first and second steps are shown in Table 1, and the powder properties and fluorescent properties of the obtained oxynitride phosphor are shown in Table 2.

Example 18

An α-sialon-based oxynitride phosphor was obtained by repeating the same operation as in Example 17 except that in the raw material preparation of the first step, calcium nitride ($Ca_3N_2$) was used as the calcium source in place of the calcium carbonate ($CaCO_3$) powder. The conditions in the synthesis of the α-sialon-based oxynitride phosphor comprising first and second steps are shown in Table 1, and the powder properties and fluorescent properties of the obtained oxynitride phosphor are shown in Table 2.

Example 19

An α-sialon-based oxynitride phosphor was obtained by repeating the same operation as in Example 17 except that in the raw material preparation of the first step, calcium nitride ($Ca_3N_2$) was used as the calcium source in place of the calcium carbonate ($CaCO_3$) powder and europium nitride (EuN) was used as the europium source in place of europium oxide ($Eu_2O_3$). The conditions in the synthesis of the α-sialon-based oxynitride phosphor comprising first and second steps are shown in Table 1, and the powder properties and fluorescent properties of the obtained oxynitride phosphor are shown in Table 2.

Example 20

An α-sialon-based oxynitride phosphor was obtained by repeating the same operation as in Example 3 except that in the raw material preparation of the first step, a europium oxide ($Eu_2O_3$) powder was weighed and added to the silicon nitride raw material to give a chemical composition of $Si_{12-(m+n)}Eu_yO_{1.5y-\delta}N_{16-4(m+n)/3}$ after firing and these were mixed. The conditions in the synthesis of the α-sialon-based oxynitride phosphor comprising first and second steps are shown in Table 1, and the powder properties and fluorescent properties of the obtained oxynitride phosphor are shown in Table 2.

Example 21

In the raw material preparation of the first step, a first raw material powder was obtained by repeating the same operation as in Example 3 except that a europium oxide ($Eu_2O_3$) powder was weighed and added to the silicon nitride raw material to give a chemical composition of $Si_{12-(m+n)}Eu_yO_{1.5y-\delta}N_{16-4(m+n)/3}$ after firing and these were mixed. The X-ray diffraction measurement of the fired powder revealed that the α-$Si_3N_4$ phase content was 95%. Also, the fired powder was observed by a scanning electron microscope, as a result, there was produced a powder where the primary particles each composed of an equiaxial crystal were dispersed and the number of aggregated particles and fused particles was extremely small. The first raw material was passed through a sieve with an opening of 350 μm.

Subsequently, an aluminum nitride (AlN) powder, an aluminum oxide ($Al_2O_3$) powder, a calcium carbonate ($CaCO_3$) powder, a lithium carbonate ($Li_2CO_3$) powder and the first raw material powder each was weighed to be blended at a ratio giving a chemical composition of $Ca_{x''}Eu_yLi_xSi_{12-(m+n)}Al_{(m+n)}O_nN_{16-n}$ after firing and make a total amount of 75 g, and these powers were put in a 1 liter-volume polyethylene-made vessel and mixed while rotating the vessel at a rotation number of 82 rpm for 3 minutes. This mixed powder was also passed through a sieve with an opening of 350 μm.

The raw material powder obtained after mixing was fired by the same operation as in Example 3 under the conditions shown in Table 1. The resultant fired power was crushed, acid-treated, washed with water, filtered and dried in the same manner as in Example 3 to obtain an α-sialon-based oxynitride phosphor. The conditions in the synthesis of the α-sialon-based oxynitride phosphor comprising first and second steps are shown in Table 1, and the powder properties and fluorescent properties of the obtained oxynitride phosphor are shown in Table 2.

Comparative Example 1

Silicon diimide ($Si(NH)_2$) obtained by reacting silicon tetrachloride and ammonia at a temperature lower than room temperature was decomposed under heating at 1,200° C. to obtain an amorphous silicon nitride powder. The metal impurity content of the amorphous silicon nitride powder was 10 ppm or less. An amorphous silicon nitride powder was used as the silicon nitride raw material and a europium oxide ($Eu_2O_3$) powder, a calcium nitride ($Ca_3N_2$) powder and an aluminum nitride (AlN) powder were weighed and added to the silicon nitride raw material to give a chemical composition of $Ca_{x''}Eu_ySi_{12-(m+n)}Al_{(m+n)}O_nN_{16-n-\delta}$ after firing, and these were mixed by a vibration mill for a predetermined time in a nitrogen atmosphere to obtain a raw material powder. The raw material powder was passed through a sieve with an opening of 350 μm.

The raw material powder obtained after mixing was filled in a silicon nitride-made crucible, the crucible was set in an electric furnace of resistance heating system, and the furnace was heated in a nitrogen gas atmosphere by a temperature-rising schedule of holding the furnace at from temperature to 1,150° C. for 2 hours and raising the temperature from 1,150° C. to 1,250° C. at 50° C./h and from 1,250° C. to a predetermined holding temperature at 100° C./h and then held under the conditions shown in Table 1 for 16 hours to effect firing. The resultant fired powder was crushed, acid-treated, washed with water, filtered and dried in the same manner as in Example 1.

The chemical composition and evaluation results of powder properties and fluorescent properties of the α-sialon-based oxynitride powder obtained through the steps above are shown in Table 2. In the evaluation of fluorescent properties, the excitation spectrum at a detection wavelength of 570 to 595 nm and the emission spectrum at an excitation wavelength of 450 nm were measured using a fluorescence measuring apparatus (FP-6500, manufactured by JASCO).

Comparative Examples 2 and 3

A europium oxide ($Eu_2O_3$) powder, a lithium carbonate ($Li_2CO_3$) powder, a calcium carbonate ($CaCO_3$) powder and an aluminum source compound selected from an aluminum nitride (AlN) powder and an aluminum oxide ($Al_2O_3$) powder were weighed and added to an amorphous silicon nitride powder to give a chemical composition of $Ca_{x'}Eu_yLi_{x'}Si_{12-(m+n)}Al_{(m+n)}O_nN_{16-n}$ after firing, and these were mixed by a vibration mill for a predetermined time in a nitrogen atmosphere to obtain a raw material powder. The raw material powder was passed through a sieve with an opening of 350 μm.

The raw material powder obtained after mixing was fired in the same manner as in Comparative Example 1 under the conditions shown in Table 1, and the fired powder crushed, acid-treated, washed with water, filtered and dried in the same manner as in Example 1.

The α-sialon-based powder obtained through the steps above was subjected to analysis of the chemical composition, observation of a particle form by an electron microscope, and evaluation of powder properties such as specific surface area and particle size distribution. The scanning electron micrograph of the produced powder was image-analyzed to determine the primary particle diameter. The produced powder was an equiaxial particle having an aspect ratio of less than 1.2 and therefore, the primary particle diameter was measured as an average of short axis diameters and long axis diameters. For evaluating the fluorescent properties of the obtained α-sialon-based powder, the excitation spectrum at a detection wavelength of 570 to 595 nm and the emission spectrum at an excitation wavelength of 450 nm were measured using a fluorescence measuring apparatus (FP-6500, manufactured by JASCO). The fluorescence property is shown in Table 2 by a relative value when the value of highest emission intensity (peak strength at 564 nm) of the emission spectrum by the same excitation wavelength of a commercially available YAG:Ce-based fluorescent material (P46Y3, produced by Kasei Optonix, Ltd.) is taken as 100.

Comparative Examples 4 to 7

Those obtained by blending a compound(s) working as a silicon nitride source(s) selected from silicon nitrogen imide ($Si_2N_2NH$), amorphous silicon nitride and crystalline silicon nitride to give a chemical composition shown in Table 1 were used as the silicon nitride raw material. A europium oxide ($Eu_2O_3$) powder, a calcium carbonate ($CaCO_3$) powder, an aluminum nitride (AlN) powder and an aluminum oxide ($Al_2O_3$) powder were weighed and added to the silicon nitride raw material to give a chemical composition of $Ca_{x'}Eu_y Si_{12-(m+n)}Al_{(m+n)}O_nN_{16-n}$, and these were mixed by a vibration mill under the conditions shown in Table 1 in a nitrogen atmosphere.

The raw material powder obtained after mixing was fired in the same manner as in Comparative Example 1 under the conditions shown in Table 1, and the fired powder was crushed, acid-treated, after passing through a sieve with a predetermined opening (from 10 to 20 μm), washed with water, filtered and dried in the same manner as in Comparative Example 1.

The chemical composition and evaluation results of powder properties and fluorescent properties of the α-sialon-based oxynitride powder obtained through the steps above are shown in Table 2. In the evaluation of fluorescent properties, the excitation spectrum at a detection wavelength of 570 to 595 nm and the emission spectrum at an excitation wavelength of 450 nm were measured using a fluorescence measuring apparatus (FP-6500, manufactured by JASCO).

FIG. 2 illustrates the emission spectrum at an excitation wavelength of 450 nm of the α-sialon-based oxynitride phosphor obtained in Comparative Example 4 together with the emission spectra of the α-sialon-based oxynitride phosphor obtained in Example 2 and a commercially available YAG:Ce-based fluorescent material (P46Y3, produced by Kasei Optonix, Ltd.).

It is seen from Table 2 that by employing a two-stage firing process where a first raw material powder obtained in a first step of mixing a compound powder selected from a europium oxide ($Eu_2O_3$) powder, a europium nitride (EuN) powder, a calcium carbonate ($CaCO_3$) powder, a calcium nitride ($Ca_3N_2$) powder and a lithium oxide precursor powder with a compound working as a silicon nitride source selected from nitrogen-containing silane compounds (silicon diimide ($Si(NH)_2$) and silicon nitrogen imide ($Si_2N_2NH$)), amorphous silicon nitride and crystalline silicon nitride and firing the mixture is mixed in a second step with a second raw material powder obtained by mixing a compound powder selected from an aluminum nitride powder, an aluminum oxide powder and a calcium carbonate powder and then again fired in the second step, a high-dispersity sialon-based oxynitride phosphor reduced in aggregation and fusion bonding is obtained. As seen from the same Table, such a phosphor where the primary particle diameter is large and the aggregation index defined as the ratio between the median diameter (secondary particle diameter) in the particle size distribution curve and the primary particle diameter is 3.0 or less has remarkably high fluorescence intensity as compared with a phosphor obtained by the conventional production method.

A lighting device using a phosphor comprising the sialon-based oxynitride is described below.

Example 22

A so-called cannonball-type white light-emitting diode (LED) lamp was produced. In this Example, the sialon-based oxynitride phosphor synthesized in Example 1 was, if desired, mixed with another phosphor powder and then mixed with an epoxy resin. First, a blue LED element was die-bonded to a recess part for placement of an element therein provided in one of a pair of lead wires, and a lead wire and the lower bottom of the blue light-emitting diode element were electrically connected and fixed. The upper electrode of the blue LED element and another lead wire were electrically connected by wire bonding. Subsequently, an appropriate amount of an epoxy resin containing the phosphor was coated by a dispenser to cover the blue LED element and cured to form a first resin part. Finally, the tip part of the lead wire, the blue light-emitting diode element and the first resin having dispersed therein a phosphor were sealed in with a second resin. In this Example, the same epoxy resin was used for both the first resin and the second resin, but another resin such as silicone resin or a transparent material such as glass may be used. As for the resin, a material as much reduced in the deterioration by ultraviolet light as possible is preferably selected.

In the case of using the sialon-based oxynitride phosphors synthesized in Examples 1 to 20, the fluorescence was uniform and free of color unevenness, the fluctuation of brightness and color within and among the lots of the product was small, and the yield of the product was high. The white LED lamp of this Example is configured to have a lens-like curved surface at the end part and therefore, is commonly called a cannonball type.

Comparative Example 8

A cannonball-type white LED lamp was produced in the same manner as in Example 21. In the case of using the sialon-based oxynitride phosphors synthesized in Comparative Examples 1 to 7, color unevenness was slightly observed in the light emitted, fluctuation of brightness and color within and among the lots of the product was large, and the yield of the product was low.

Example 23

Figure 3:
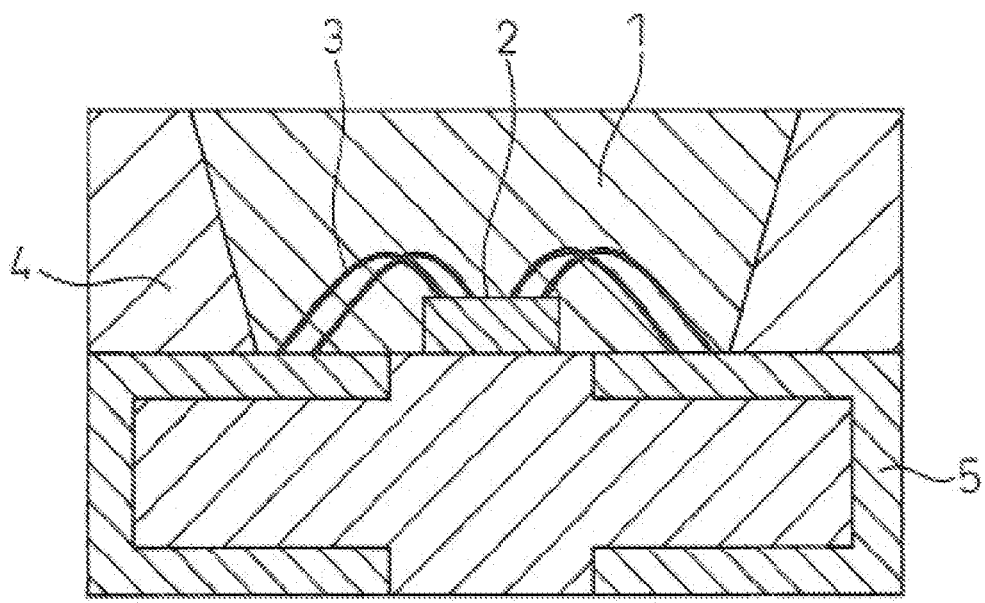
FIG. 3 is a view illustrating a schematic cross-sectional structural example of the light-emitting device in which the α-sialon-based oxynitride phosphor is used.

A chip-type white LED lamp for substrate mounting shown in FIG. 3 was produced. A liquid epoxy resin having a viscosity of 50 P at room temperature was used as the light-transmitting resin. The α-sialon-based oxynitride phosphor obtained in Example was mixed with the epoxy resin in a mass ratio of 6:100 to obtain a kneaded product having dispersed therein a phosphor. The kneaded product was coated on LED as the light source and used as a layer that emits fluorescence. As for the light source, a blue LED with the light-emitting layer containing an $In_nAl_mGa_{1-(m+n)}N$ nitride-based semiconductor having a main emission peak at 450 to 470 nm was prepared. In the recess part of the molded package 4 shown in FIG. 3, this blue LED 2 was fixed with the epoxy resin 1 above. Using a 35-μm gold wire, each electrode of the blue LED and each lead electrode 5 were wire-bonded and thereby electrically connected. The epoxy resin containing the α-sialon-based oxynitride phosphor was poured in the recess part of the molded package 4, in which the blue LED 2 was disposed, and then cured at 120° C. for 4 hours to obtain a white LED lamp where the light source was coated with a fluorescent layer.

For confirming that the obtained chip-type white LED lamp for substrate mounting functions as a lighting device emitting white light, the emission properties were measured for 500 units of each white LED lamp, the average value and standard deviation of emission intensity were examined, and the fluctuation status of properties among devices was grasped. The fluctuation status of color tone was examined.

In the case of using the sialon-based oxynitride phosphors synthesized in Examples 1 to 20, the fluorescence was uniform and free of color unevenness, the fluctuation of brightness and color within and among the lots of the product was small, and the yield of the product was high.

Comparative Example 9

A chip-type white light-emitting diode lamp for substrate mounding was produced in the same manner as in Example 22. In the case of using the sialon-based oxynitride phosphors synthesized in Comparative Examples 1 to 7, color unevenness was slightly observed in the light emitted, the fluctuation of brightness and color within and among the lots of the product was large, and the yield of the product was low.

An image display device using the phosphor is described below.

Example 24

The phosphor obtained in Example 1 was coated on the inner face of a cell for a plasma display panel, and a current was passed to the electrode to generate a vacuum ultraviolet ray by Xe discharge in the cell. It was confirmed that the phosphor is excited by this vacuum ultraviolet ray and emits yellow visible light, the light emitted is observed from the outside through the protective layer, dielectric layer and glass substrate, and the device functions as an image display.

TABLE 1

| | Blending Composition and Firing Conditions in First Step | | | | | | | | |
|---|---|---|---|---|---|---|---|---|---|
| | Weight Ratio of $Si_3N_4$ Source | | | | Compound of Metal M | Compound of Lanthanide Metal Ln | Compound of Al Source | Mixing Time in Vibration Mill (min) | Nitrogen Gas Pressure (atm) | Highest Holding Temperature (° C.) |
| | Crystalline $Si_3N_4$ | Amorphous $Si_3N_4$ | $Si_2N_2NH$ | $Si(NH)_2$ | | | | | | |
| Example 1 | 0 | 20 | 50 | 30 | $Li_2CO_3$, $CaCO_3$ | $Eu_2O_3$ | — | 25 | 1.0 | 1635 |
| Example 2 | 0 | 50 | 50 | 0 | $Li_2CO_3$, $CaCO_3$ | $Eu_2O_3$ | — | 25 | 1.0 | 1625 |
| Example 3 | 0 | 60 | 40 | 0 | $Li_2CO_3$ | $Eu_2O_3$ | — | 35 | 1.0 | 1615 |
| Example 4 | 0 | 30 | 50 | 20 | $Li_2CO_3$ | $Eu_2O_3$ | — | 25 | 1.0 | 1625 |
| Example 5 | 0 | 70 | 30 | 0 | $Li_2CO_3$ | $Eu_2O_3$ | — | 40 | 1.0 | 1610 |
| Example 6 | 0 | 75 | 25 | 0 | $Li_2CO_3$ | $Eu_2O_3$ | — | 45 | 1.0 | 1610 |
| Example 7 | 0 | 100 | 0 | 0 | $Li_2CO_3$ | $Eu_2O_3$ | — | 65 | 1.0 | 1605 |
| Example 8 | 0 | 80 | 20 | 0 | $LiNO_3$ | $Eu_2O_3$ | — | 50 | 5.0 | 1610 |
| Example 9 | 0 | 10 | 50 | 40 | $Li_2CO_3$ | $Eu_2O_3$ | — | 20 | 1.0 | 1650 |
| Example 10 | 0 | 0 | 45 | 55 | $LiNO_3$ | $Eu_2O_3$ | — | 20 | 10 | 1620 |
| Example 11 | 0 | 100 | 0 | 0 | LiOH | $Eu_2O_3$ | — | 70 | 1.0 | 1595 |
| Example 12 | 0 | 100 | 0 | 0 | LiOH | $Eu_2O_3$ | — | 60 | 1.0 | 1605 |
| Example 13 | 0 | 60 | 40 | 0 | $Li_2CO_3$ | $Eu_2O_3$ | — | 30 | 1.0 | 1610 |
| Example 14 | 0 | 80 | 20 | 0 | LiOH | $Eu_2O_3$ | — | 50 | 1.0 | 1615 |
| Example 15 | 0 | 90 | 10 | 0 | LiOH | $Eu_2O_3$ | — | 55 | 1.0 | 1615 |
| Example 16 | 20 | 80 | 0 | 0 | $CaCO_3$ | $Eu_2O_3$ | — | 40 | 1.0 | 1630 |
| Example 17 | 0 | 40 | 50 | 10 | $Li_2CO_3$, $CaCO_3$ | $Eu_2O_3$ | — | 30 | 1.0 | 1630 |
| Example 18 | 0 | 60 | 40 | 0 | $Li_2CO_3$, $Ca_3N_2$ | $Eu_2O_3$ | — | 30 | 1.0 | 1625 |

TABLE 1-continued

| | | | | | | | | | | |
|---|---|---|---|---|---|---|---|---|---|---|
| Example 19 | 0 | 55 | 45 | 0 | Li$_2$CO$_3$, Ca$_3$N$_2$ | EuN | — | 35 | 1.0 | 1635 |
| Example 20 | 35 | 65 | 0 | 0 | — | Eu$_2$O$_3$ | — | 45 | 1.0 | 1625 |
| Example 21 | 0 | 100 | 0 | 0 | — | Eu$_2$O$_3$ | — | 60 | 1.0 | 1585 |
| Comparative Example 1 | 0 | 100 | 0 | 0 | Ca$_3$N$_2$ | Eu$_2$O$_3$ | AlN | 35 | 1.0 | 1650 |
| Comparative Example 2 | 0 | 100 | 0 | 0 | Li$_2$CO$_3$, CaCO$_3$ | Eu$_2$O$_3$ | AlN | 45 | 1.0 | 1630 |
| Comparative Example 3 | 0 | 100 | 0 | 0 | Li$_2$CO$_3$, CaCO$_3$ | Eu$_2$O$_3$ | AlN, Al$_2$O$_3$ | 40 | 1.0 | 1650 |
| Comparative Example 4 | 0 | 100 | 0 | 0 | CaCO$_3$ | Eu$_2$O$_3$ | AlN, Al$_2$O$_3$ | 50 | 1.0 | 1630 |
| Comparative Example 5 | 50 | 50 | 0 | 0 | CaCO$_3$ | Eu$_2$O$_3$ | AlN, Al$_2$O$_3$ | 60 | 1.0 | 1600 |
| Comparative Example 6 | 0 | 80 | 20 | 0 | CaCO$_3$ | Eu$_2$O$_3$ | AlN, Al$_2$O$_3$ | 20 | 10 | 1780 |
| Comparative Example 7 | 65 | 35 | 0 | 0 | CaCO$_3$ | Eu$_2$O$_3$ | AlN, Al$_2$O$_3$ | 30 | 1.0 | 1640 |

| | Blending Composition in Second Step | | Firing Conditions in Third Step | |
|---|---|---|---|---|
| | Compound of Metal M | Compound of Al Source | Nitrogen Gas Pressure (atm) | Highest Holding Temperature (° C.) |
| Example 1 | — | AlN, Al$_2$O$_3$ | 1.0 | 1650 |
| Example 2 | — | AlN, Al$_2$O$_3$ | 1.0 | 1640 |
| Example 3 | C$_a$CO$_3$ | AlN, Al$_2$O$_3$ | 1.0 | 1640 |
| Example 4 | C$_a$CO$_3$ | AlN, Al$_2$O$_3$ | 1.0 | 1650 |
| Example 5 | C$_a$CO$_3$ | AlN, Al$_2$O$_3$ | 1.0 | 1630 |
| Example 6 | C$_a$CO$_3$ | AlN, Al$_2$O$_3$ | 1.0 | 1630 |
| Example 7 | C$_a$CO$_3$ | AlN, Al$_2$O$_3$ | 1.0 | 1620 |
| Example 8 | C$_a$CO$_3$ | AlN, Al$_2$O$_3$ | 1.0 | 1620 |
| Example 9 | C$_a$CO$_3$ | AlN, Al$_2$O$_3$ | 1.0 | 1660 |
| Example 10 | C$_a$CO$_3$ | AlN, Al$_2$O$_3$ | 10 | 1800 |
| Example 11 | C$_a$CO$_3$ | AlN, Al$_2$O$_3$ | 1.0 | 1620 |
| Example 12 | C$_a$CO$_3$ | AlN, Al$_2$O$_3$ | 1.0 | 1630 |
| Example 13 | C$_a$CO$_3$ | AlN, Al$_2$O$_3$ | 1.0 | 1630 |
| Example 14 | C$_a$CO$_3$ | AlN, Al$_2$O$_3$ | 1.0 | 1640 |
| Example 15 | C$_a$CO$_3$ | AlN, Al$_2$O$_3$ | 1.0 | 1630 |
| Example 16 | — | AlN, Al$_2$O$_3$ | 1.0 | 1650 |
| Example 17 | — | AlN | 1.0 | 1650 |
| Example 18 | — | AlN | 1.0 | 1640 |
| Example 19 | — | AlN | 1.0 | 1645 |
| Example 20 | C$_a$CO$_3$ | AlN, Al$_2$O$_3$ | 1.0 | 1640 |
| Example 21 | Li$_2$CO$_3$, CaCO$_3$ | AlN, Al$_2$O$_3$ | 1.0 | 1675 |
| Comparative Example 1 | — | — | — | — |
| Comparative Example 2 | — | — | — | — |
| Comparative Example 3 | — | — | — | — |
| Comparative Example 4 | — | — | — | — |
| Comparative Example 5 | — | — | — | — |
| Comparative Example 6 | — | — | — | — |
| Comparative Example 7 | — | — | — | — |

TABLE 2

| | X-Ray Diffraction α-Sialon Phase Produced (wt %) | Chemical Composition and Oxygen Amount of Product | | | | | | | Observation by Electron Microscope | |
|---|---|---|---|---|---|---|---|---|---|---|
| | | Composition of Product | | | | | | | Primary | |
| | | Si 12 − (m + n) | Al m + n | O n | N 16 − n | Li x1 | Ca x2 | Eu y | Oxygen Content (wt %) | Particle Diameter (μm) | Crystal Form |
| Example 1 | >98 | 9.25 | 2.75 | 1.07 | 14.94 | 0.10 | 0.62 | 0.15 | 2.8 | 3.2 | equiaxial crystal |
| Example 2 | 97 | 9.25 | 2.75 | 1.07 | 14.94 | 0.10 | 0.62 | 0.15 | 2.8 | 2.8 | equiaxial crystal |
| Example 3 | 97 | 9.22 | 2.78 | 1.08 | 14.93 | 0.15 | 0.60 | 0.15 | 2.8 | 2.7 | equiaxial crystal |
| Example 4 | >98 | 9.22 | 2.78 | 1.08 | 14.93 | 0.15 | 0.60 | 0.15 | 2.8 | 2.9 | equiaxial crystal |
| Example 5 | 97 | 9.15 | 2.85 | 1.09 | 14.91 | 0.05 | 0.73 | 0.10 | 2.9 | 2.3 | equiaxial crystal |
| Example 6 | 97 | 9.15 | 2.85 | 1.10 | 14.90 | 0.05 | 0.73 | 0.10 | 2.9 | 2.1 | equiaxial crystal |
| Example 7 | 96 | 9.15 | 2.85 | 1.09 | 14.91 | 0.05 | 0.73 | 0.10 | 2.9 | 1.6 | equiaxial crystal |

TABLE 2-continued

| | | | | | | | | | | | |
|---|---|---|---|---|---|---|---|---|---|---|---|
| Example 8 | 95 | 9.08 | 2.92 | 1.12 | 14.88 | 0.10 | 0.72 | 0.10 | 3.0 | 2.0 | equiaxial crystal |
| Example 9 | 96 | 9.15 | 2.85 | 1.08 | 14.92 | 0.05 | 0.73 | 0.10 | 2.9 | 3.4 | equiaxial crystal |
| Example 10 | 95 | 9.08 | 2.92 | 1.12 | 14.88 | 0.10 | 0.72 | 0.10 | 3.0 | 3.5 | equiaxial crystal |
| Example 11 | 95 | 9.03 | 2.97 | 1.14 | 14.86 | 0.15 | 0.71 | 0.10 | 3.0 | 1.5 | equiaxial crystal |
| Example 12 | 94 | 8.90 | 3.10 | 1.17 | 14.82 | 0.10 | 0.83 | 0.05 | 3.1 | 1.7 | equiaxial crystal |
| Example 13 | 94 | 8.83 | 3.17 | 1.17 | 14.82 | 0.05 | 0.82 | 0.05 | 3.1 | 2.5 | equiaxial crystal |
| Example 14 | 94 | 8.91 | 3.09 | 1.21 | 14.80 | 0.00 | 0.87 | 0.05 | 3.2 | 2.0 | equiaxial crystal |
| Example 15 | 94 | 8.90 | 3.10 | 1.18 | 14.82 | 0.10 | 0.83 | 0.05 | 3.1 | 1.8 | equiaxial crystal |
| Example 16 | 95 | 9.06 | 2.94 | 1.21 | 14.81 | 0.00 | 0.78 | 0.10 | 3.2 | 2.5 | equiaxial crystal |
| Example 17 | >98 | 9.00 | 3.02 | 0.87 | 15.12 | 0.05 | 0.81 | 0.05 | 2.3 | 2.7 | equiaxial crystal |
| Example 18 | 97 | 9.30 | 2.70 | 0.70 | 15.22 | 0.05 | 0.63 | 0.15 | 1.8 | 2.7 | equiaxial crystal |
| Example 19 | 96 | 9.15 | 2.85 | 0.51 | 15.32 | 0.05 | 0.73 | 0.10 | 1.4 | 2.7 | equiaxial crystal |
| Example 20 | 94 | 8.97 | 3.03 | 1.29 | 14.74 | 0.00 | 0.87 | 0.05 | 3.4 | 1.8 | equiaxial crystal |
| Example 21 | 95 | 8.91 | 3.09 | 1.16 | 14.83 | 0.10 | 0.82 | 0.05 | 3.1 | 1.8 | equiaxial crystal |
| Comparative Example 1 | 91 | 9.12 | 2.88 | 0.71 | 15.21 | 0.0 | 0.78 | 0.10 | 1.9 | 1.1 | aggregated/fused particle |
| Comparative Example 2 | 92 | 8.99 | 3.01 | 0.89 | 15.10 | 0.05 | 0.82 | 0.05 | 2.4 | 1.0 | aggregated/fused particle |
| Comparative Example 3 | 91 | 8.85 | 3.15 | 1.18 | 14.81 | 0.05 | 0.82 | 0.05 | 3.1 | 1.0 | aggregated/fused particle |
| Comparative Example 4 | 90 | 9.08 | 2.92 | 1.23 | 14.79 | 0.0 | 0.78 | 0.10 | 3.2 | 0.9 | aggregated/fused particle |
| Comparative Example 5 | 90 | 9.00 | 3.00 | 1.28 | 14.75 | 0.0 | 0.87 | 0.05 | 3.4 | 0.8 | aggregated/fused particle |
| Comparative Example 6 | 93 | 9.11 | 2.89 | 1.26 | 14.76 | 0.0 | 0.78 | 0.10 | 3.3 | 2.0 | aggregated/fused particle |
| Comparative Example 7 | 88 | 9.01 | 2.99 | 1.31 | 14.70 | 0.0 | 0.87 | 0.05 | 3.5 | 1.4 | aggregated/fused particle |

| | Powder Properties | | | | | | Aggregation Index | | Fluorescent Properties Emission Spectrum | |
|---|---|---|---|---|---|---|---|---|---|---|
| | | | Particle Size Distribution | | | | | | | |
| | Specific Surface Area ($m^2/g$) | Equivalent-Sphere Diameter $D_{BET}$ | 10% Diameter $d_{10}$ | Median Diameter $d_{50}$ | 90% Diameter $d_{90}$ | Particle Diameter Ratio $d_{90}/d_{10}$ | A1 $d_{50}/D_{BET}$ | A2 $d_{50}/D_{particle}$ | Maximum Emission Wavelength (nm) | Emission Intensity (relative value) |
| Example 1 | 0.45 | 4.1 | 2.5 | 4.5 | 8.3 | 3.3 | 1.1 | 1.4 | 588 | 174 |
| Example 2 | 0.42 | 4.4 | 2.5 | 4.4 | 8.7 | 3.5 | 1.0 | 1.6 | 587 | 172 |
| Example 3 | 0.44 | 4.2 | 2.5 | 4.6 | 8.8 | 3.6 | 1.1 | 1.7 | 587 | 167 |
| Example 4 | 0.46 | 4.0 | 2.8 | 4.8 | 9.7 | 3.5 | 1.2 | 1.7 | 587 | 169 |
| Example 5 | 0.54 | 3.4 | 2.3 | 4.1 | 8.0 | 3.5 | 1.2 | 1.8 | 586 | 159 |
| Example 6 | 0.62 | 3.0 | 2.3 | 3.9 | 8.3 | 3.5 | 1.3 | 1.9 | 586 | 158 |
| Example 7 | 0.84 | 2.2 | 1.9 | 3.1 | 5.4 | 2.8 | 1.4 | 1.9 | 586 | 155 |
| Example 8 | 0.69 | 2.7 | 2.9 | 4.0 | 7.2 | 2.5 | 1.5 | 2.0 | 585 | 157 |
| Example 9 | 0.45 | 4.1 | 3.4 | 6.4 | 11.3 | 3.4 | 1.5 | 1.9 | 586 | 158 |
| Example 10 | 0.44 | 4.2 | 3.5 | 6.9 | 12.2 | 3.5 | 1.6 | 2.0 | 585 | 159 |
| Example 11 | 0.87 | 2.1 | 1.8 | 3.2 | 6.5 | 3.6 | 1.5 | 2.1 | 584 | 153 |
| Example 12 | 0.81 | 2.3 | 2.2 | 3.9 | 6.8 | 3.1 | 1.7 | 2.3 | 581 | 146 |
| Example 13 | 0.58 | 3.2 | 3.1 | 5.8 | 11.1 | 3.6 | 1.8 | 2.3 | 580 | 144 |
| Example 14 | 0.67 | 2.8 | 2.6 | 4.7 | 9.2 | 3.5 | 1.7 | 2.4 | 582 | 149 |
| Example 15 | 0.79 | 2.3 | 2.3 | 4.2 | 7.2 | 3.1 | 1.8 | 2.4 | 581 | 148 |
| Example 16 | 0.56 | 3.3 | 3.5 | 6.3 | 11.4 | 3.3 | 1.9 | 2.5 | 584 | 147 |
| Example 17 | 0.46 | 4.0 | 2.2 | 4.0 | 7.8 | 3.5 | 1.0 | 1.5 | 583 | 140 |
| Example 18 | 0.44 | 4.2 | 2.2 | 3.8 | 7.5 | 3.3 | 0.9 | 1.4 | 589 | 148 |
| Example 19 | 0.42 | 4.4 | 2.1 | 3.5 | 6.7 | 3.2 | 0.8 | 1.3 | 586 | 144 |
| Example 20 | 0.83 | 2.2 | 2.3 | 5.1 | 10.0 | 4.3 | 2.3 | 2.8 | 583 | 132 |
| Example 21 | 0.79 | 2.4 | 2.3 | 4.0 | 7.0 | 3.0 | 1.7 | 2.3 | 584 | 140 |
| Comparative Example 1 | 1.6 | 1.2 | 1.7 | 4.2 | 12.4 | 7.2 | 3.6 | 3.9 | 585 | 122 |
| Comparative Example 2 | 1.9 | 1.0 | 1.3 | 3.4 | 9.0 | 6.9 | 3.4 | 3.5 | 585 | 121 |
| Comparative Example 3 | 1.7 | 1.1 | 1.8 | 4.4 | 13.2 | 7.4 | 3.9 | 4.3 | 583 | 124 |
| Comparative Example 4 | 1.9 | 1.0 | 1.8 | 4.1 | 13.4 | 7.5 | 4.1 | 4.5 | 580 | 114 |
| Comparative Example 5 | 2.3 | 0.8 | 1.5 | 3.8 | 9.4 | 6.2 | 4.7 | 4.7 | 583 | 110 |
| Comparative Example 6 | 0.8 | 2.3 | 2.5 | 8.5 | 21.6 | 8.7 | 3.7 | 4.2 | 585 | 125 |
| Comparative Example 7 | 1.2 | 1.5 | 2.5 | 9.1 | 23.4 | 9.3 | 5.9 | 6.4 | 583 | 106 |

INDUSTRIAL APPLICABILITY

The high-dispersity phosphor powder with reduced aggregation or fusion bonding and narrow particle size distribution can be uniformly mixed with a resin or the like and then easily coated on blue LED, so that a highly-bright white LED can be easily obtained. Furthermore, according to the production method, the above-described high-dispersity phosphor powder excellent in miscibility with a resin can be easily obtained.

The invention claimed is:

1. A method of producing an oxynitride phosphor comprising an α-sialon represented by:

wherein 0.3≤x+y<1.5, 0<y<0.7, 0.3≤m<4.5, 0<n<2.25, and wherein the atomic valence of metal M is a and the atomic valence of lanthanide metal Ln is b, m=ax+by,
as a main component, said method comprising:
(A) firing a mixed powder at 1,400 to 1,800° C. in a nitrogen-containing inert gas atmosphere to obtain a first raw material powder, said mixed powder obtained by adding to a silicon nitride powder at least one kind of a metal compound selected from the group consisting of
(i) a nitride, an oxynitride, an oxide or a precursor substance becoming an oxide upon thermal decomposition, of metal M, wherein M is at least one metal selected from the group consisting of Li, Ca, Mg, Ba, Sr, Y and a lanthanide metal excluding La, Ce, Pr, Eu, Dy, Er, Tb and Yb, and
(ii) a nitride, an oxynitride, an oxide or a precursor substance becoming an oxide upon thermal decomposition of lanthanide metal Ln, wherein Ln is at least one lanthanide metal selected from the group consisting of Ce, Pr, Eu, Dy, Er, Tb and Yb,
(B) adding to said first raw material powder at least one metal compound selected from the group consisting of:
(i) a nitride, an oxynitride, an oxide or a precursor substance becoming an oxide upon thermal decomposition, of said metal M,
(ii) a nitride, an oxynitride, an oxide or a precursor substance becoming an oxide upon thermal decomposition, of said lanthanide metal Ln substituting a part or all of said metal element M to work as a luminescence center, and
(iii) an aluminum nitride powder, an aluminum oxynitride powder, an aluminum oxide powder or a precursor powder becoming aluminum oxide upon thermal decomposition,
and weighing and mixing the compound and powder to produce said α-sialon composition thereby obtaining a mixed powder, and
(C) firing the obtained mixed powder at 1,500 to 2,000° C. in a nitrogen-containing inert gas atmosphere.

2. The method as claimed in claim 1, wherein said step (B) comprises mixing at least one kind of a metal compound selected from the group consisting of
(i) a nitride, an oxynitride, an oxide or a precursor substance becoming an oxide upon thermal decomposition, of said metal M, and
(ii) a nitride, an oxynitride, an oxide or a precursor substance becoming an oxide upon thermal decomposition, of said lanthanide metal Ln,
together with
(iii) at least one kind of an aluminum compound powder selected from the group of an aluminum nitride powder, an aluminum oxynitride powder, an aluminum oxide powder and a precursor powder becoming aluminum oxide upon thermal decomposition,
to obtain a second raw material powder, and weighing and mixing said first raw material powder and said second raw material powder to produce said α-sialon composition represented by the formula above, thereby obtaining a mixed powder.

3. The method as claimed in claim 1, wherein said step (A) comprises firing a mixed powder at 1,400 to 1,800° C. in a nitrogen-containing inert gas atmosphere to obtain a first raw material powder, said mixed powder being obtained by adding to a silicon nitride power:
(i) at least one kind of a metal M compound selected from the group consisting of a nitride, an oxynitride, an oxide and a precursor substance becoming an oxide upon thermal decomposition, of said metal M, and
(ii) at least one kind of a metal Ln compound selected from the group consisting of a nitride, an oxynitride, an oxide and a precursor substance becoming an oxide upon thermal decomposition, of said lanthanide metal Ln,
and said step (B) comprises mixing two or more kinds of aluminum compound powders selected from the group consisting of (iii) an aluminum nitride powder, an aluminum oxynitride powder, an aluminum oxide powder and a precursor powder becoming aluminum oxide upon thermal decomposition, to obtain a second raw material powder, and weighing and mixing said first raw material powder and said second raw material powder to produce said α-sialon composition, thereby obtaining a mixed powder.

4. The method as claimed in claim 1, wherein:
said step (A) comprises firing a mixed powder consisting of at least one kind of a europium compound powder selected from a europium nitride powder, a europium oxynitride powder, a europium oxide powder and a precursor powder becoming europium oxide upon thermal decomposition, and a silicon nitride powder at 1,400 to 1,800° C. in a nitrogen-containing inert gas atmosphere to obtain a first raw material powder, and
said step (B) comprises adding:
at least one aluminum compound powder selected from the group consisting of an aluminum nitride powder, an aluminum oxynitride powder, an aluminum oxide powder and a precursor powder becoming aluminum oxide upon thermal decomposition,
at least one calcium compound powder selected from a calcium nitride powder, a calcium oxynitride powder, a calcium oxide powder and a precursor powder becoming calcium oxide upon thermal decomposition, and
at least one lithium compound powder selected from a lithium oxide powder and a precursor powder becoming lithium oxide upon thermal decomposition,
to said first raw material powder, and weighing and mixing these powders to produce α-sialon composition represented by:

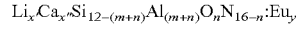

(wherein 0.3≤x'+x"+y<1.5, 0<y<0.7, 0.3≤m<4.5, 0<n<2.25, and wherein the atomic valence of europium Eu is b, m=x'+2x"+by), thereby obtaining a mixed powder.

5. The method as claimed in claim 2, wherein:
said step (A) comprises firing a mixed powder consisting of:
at least one europium compound powder selected from a europium nitride powder, a europium oxynitride powder, a europium oxide powder and a precursor powder becoming europium oxide upon thermal decomposition,
at least one lithium compound powder selected from a lithium oxide powder and a precursor powder becoming lithium oxide upon thermal decomposition, and a silicon nitride powder, at 1,400 to 1,800° C. in a nitrogen-containing inert gas atmosphere to obtain a first raw material powder, and said step (B) comprises mixing:

at least one aluminum compound powder selected from the group consisting of an aluminum nitride powder, an aluminum oxynitride powder, an aluminum oxide powder and a precursor powder becoming aluminum oxide upon thermal decomposition, and at least one calcium compound powder selected from the group consisting of a calcium nitride powder, a calcium oxynitride powder, a calcium oxide powder and a precursor powder becoming calcium oxide upon thermal decomposition, to obtain a second raw material powder, and weighting and mixing said first raw material powder and said second raw material powder to produce α-sialon composition represented by:

$$Li_xCa_{x''}Si_{12-(m+n)}Al_{(m+n)}O_nN_{16-n}:Eu_y$$

(wherein $0.3 \leq x'+x''+y<1.5$, $0<y<0.7$, $0.3 \leq m<4.5$, $0<n<2.25$, and wherein the atomic valence of europium Eu is b, $m=x'+2x''+by$), thereby obtaining a mixed powder.

6. The method as claimed in claim 3, wherein:

said step (A) comprises firing a mixed powder consisting of:

at least one europium compound powder selected from the group of a europium nitride powder, a europium oxynitride powder, a europium oxide powder and a precursor powder becoming europium oxide upon thermal decomposition, at least one calcium compound powder selected from the group of a calcium nitride powder, a calcium oxynitride powder, a calcium oxide powder and a precursor powder becoming calcium oxide upon thermal decomposition, a lithium oxide powder or a precursor powder becoming lithium oxide upon thermal decomposition, and a silicon nitride powder, at 1,400 to 1,800° C. in a nitrogen-containing inert gas atmosphere to obtain a first raw material powder, and said step (B) comprises:

mixing at least two kinds of aluminum compound powders selected from an aluminum nitride powder, an aluminum oxynitride powder, an aluminum oxide powder and a precursor powder becoming aluminum oxide upon thermal decomposition to obtain a second raw material powder, and weighting and mixing said first raw material powder and said second raw material powder to produce said α-sialon composition represented by:

$$Li_xCa_{x''}Si_{12-(m+n)}Al_{(m+n)}O_nN_{16-n}:Eu_y$$

(wherein $0.3 \leq x'+x''+y<1.5$, $0<y<0.7$, $0.3 \leq m<4.5$, $0<n<2.25$, and wherein the atomic valence of europium Eu is b, $m=x'+2x''+by$), thereby obtaining a mixed powder.

7. The method as claimed in claim 1, wherein said silicon nitride powder is at least one silicon nitride powder selected from an amorphous silicon nitride and a crystalline silicon nitride.

8. The method as claimed in claim 6, wherein said silicon nitride powder is a mixture of two or more kinds of silicon nitride powders selected from an amorphous silicon nitride and a crystalline silicon nitride.

9. The method as claimed in claim 1, wherein the oxynitride phosphor comprising an α-sialon as the main component obtained by firing is acid-washed to remove the excessive glass phase.

* * * * *

UNITED STATES PATENT AND TRADEMARK OFFICE
CERTIFICATE OF CORRECTION

| | | |
|---|---|---|
| PATENT NO. | : 8,628,687 B2 | Page 1 of 1 |
| APPLICATION NO. | : 13/611824 | |
| DATED | : January 14, 2014 | |
| INVENTOR(S) | : Yamao et al. | |

It is certified that error appears in the above-identified patent and that said Letters Patent is hereby corrected as shown below:

In the Specification

In Column 2,

Line 67, change "*particle*'" to --*particle.*--.

Signed and Sealed this
Twenty-sixth Day of August, 2014

Michelle K. Lee
*Deputy Director of the United States Patent and Trademark Office*